United States Patent [19]

Asakura

[11] Patent Number: 5,495,440
[45] Date of Patent: Feb. 27, 1996

[54] SEMICONDUCTOR MEMORY DEVICE HAVING HIERARCHICAL BIT LINE STRUCTURE

[75] Inventor: Mikio Asakura, Hyogo, Japan

[73] Assignee: Mitsubishi Denki Kabushiki Kaisha, Tokyo, Japan

[21] Appl. No.: 321,711

[22] Filed: Oct. 12, 1994

[30] Foreign Application Priority Data

Oct. 19, 1993 [JP] Japan .................. 5-261078

[51] Int. Cl.$^6$ ................................ G11C 11/24
[52] U.S. Cl. .................. 365/149; 365/52; 365/63; 365/190; 365/230.03
[58] Field of Search ................ 365/149, 51, 52, 365/63, 190, 207, 230.03

[56] References Cited

U.S. PATENT DOCUMENTS

| | | | |
|---|---|---|---|
| 4,926,382 | 5/1990 | Sakui et al. | 365/149 |
| 5,353,255 | 10/1994 | Komuro | 365/149 X |
| 5,367,481 | 11/1994 | Takase et al. | 365/149 |

FOREIGN PATENT DOCUMENTS 62-298089  12/1987  Japan .

OTHER PUBLICATIONS

"Cell–Plate Line Connecting Complementary Bit–Line ($C^3$) Architecture for Battery–Operating DRAMS's", Mikio Asakura et al., IEEE Journal of Solid–State Circuits, vol. 27, No. 4, Apr. 1992, pp. 597–602.

*Primary Examiner*—David C. Nelms
*Assistant Examiner*—Huan Hoang
*Attorney, Agent, or Firm*—Lowe, Price, LeBlanc & Becker

[57] ABSTRACT

A memory cell array is divided into a plurality of memory cell groups in the column direction. In each memory cell group, a sub-bit line SBL and a sub-cell plate line SCPL are located. A pair of main bit lines are arranged for memory cells on one column. For each sub-cell plate line, a switching transistor is provided connecting the sub-cell plate line to one main bit line in response to a group select signal. For each sub-bit line, a switching transistor is provided connecting corresponding sub-bit lines to the other main bit line in response to a group select signal BS. A constant voltage VBL is transmitted to the sub-cell plate line through a switching transistor rendered conductive in response to a group select signal CPPR. A dynamic type semiconductor memory device is provided whose memory array layout is facilitated and in which a sufficient read potential difference is produced on a pair of bit lines upon word line selection.

29 Claims, 18 Drawing Sheets

SEMICONDUCTOR MEMORY DEVICE HAVING HIERARCHICAL BIT LINE STRUCTURE

BACKGROUND OF THE INVENTION

1. Field of the Invention

The present invention generally relates to semiconductor memory devices, and more particularly, to a Dynamic Random Access Memory (DRAM) in which a memory cell stores information in a capacitor in a form of electric charges. More particularly, the present invention relates to a dynamic random access memory in which a bit line is structured of sub-bit lines to which memory cells are connected, and a main bit line to which the sub-bit lines are connected.

2. Description of the Background Art

FIG. 18 schematically shows a structure of a memory cell array portion of a conventional dynamic random access memory. The structure shown in FIG. 18 is disclosed in, for example, Japanese Patent Laying-Open No. 62-298089. In FIG. 18, a structure of a portion is shown relating to memory cells on one column.

Referring to FIG. 18, memory cells MC are divided into N groups 10A to 10N. Each memory cell MC includes a transistor 7 and a capacitor 8 having one electrode connected to transistor 7.

Sub-bit lines 20A, 30A, . . . are located corresponding to each of N memory cell groups. In FIG. 18, only sub-bit lines 20A and 30A in memory cell group 10A are shown. Transistors 7 of memory cells MC are alternately connected to sub-bit lines 20A and 30A. The other electrodes (electrodes not connected to transistors 7) of capacitors 8 of memory cells MC are connected to a cell plate line 52 in common. A constant voltage Vcp is transmitted to cell plate line 52.

Main bit lines 2 and 3 are arranged in common for memory cell groups 10A to 10N. Switch circuits 5A to 5N and 6A to 6N are provided corresponding to memory cell groups 10A to 10N.

Switch circuits 5A to 5N connect sub-bit lines 20A, 30A, . . . of corresponding memory cell groups to main bit lines 2 and 3 in response to block select signals φSA to φSN from block selecting circuits 17A to 17N.

Switch circuits 6A to 6N disconnect sub-bit lines 20A, 30A, . . . of corresponding memory cell groups from a constant voltage VD supply transmission line 4 in response to block select signals /φSA to /φSN applied through inverter circuits 15A to 15N.

Word lines 9-1 to 9-M, . . . are arranged corresponding to transistors 7 of memory cells MC in the direction crossing main bit lines 2 and 3 (sub-bit lines 20A, 30A, . . . ). In FIG. 18, only word lines 9-1 to 9-M in memory cell group 10A are shown. A row select signal from a row decoder 16 is applied to word lines 9-1 to 9-M. Row decoder 16 decodes row address bits (not shown), and brings one word line to a selected state. Block selecting circuits 17A to 17N bring a block select signal to an active state only for a memory cell group including the selected word line.

A peripheral circuit 18 is provided for main bit lines 2 and 3, which includes a sense amplifier, an IO gate for transmitting a sense amplifier output onto an internal data bus, and the like. Operation will now be described.

In a stand-by state, outputs of row decoder 16 and block selecting circuits 17A to 17N are all at a low level. Accordingly, switch circuits 5A to 5N are in an off state, and switch circuits 6A to 6N are in an on state. In memory cell groups 10A to 10N, sub-bit lines 20A, 30A, . . . are precharged to a constant reference voltage VD through switch circuits 6A to 6N. Cell plate line 52 is normally supplied with a constant voltage Vcp.

In access, an access start instructing signal such as a row address strobe signal /RAS and a chip enable signal /CE is externally applied. In response to the access start instructing signal, an internal address signal is generated (according to an externally applied address signal), to be applied to row decoder 16 and block selecting circuits 17A to 17N. Row decoder 16 decodes the applied internal address signal, and generates a signal selecting one word line. In order to select a memory cell group, block selecting circuits 17A to 17N bring a block select signal for a memory cell group including the selected word line to an active state at this time. Now, assume that word line 9-1 is selected.

First, a signal φSA of block selecting circuit 17A attains a high level, and block select signal /φSA attains a low level. Accordingly, switch circuits 5A and 6A are brought to on and off states, respectively, and sub-bit lines 20A and 30A are connected to main bit lines 2 and 3. Sub-bit lines 20A and 30A are disconnected from constant voltage VD, and brought to a floating state.

When the potential of word line 9-1 rises to a high level, transistor 7 of memory cell MC is brought to an on state, and electric charges stored in capacitors 8 are transmitted onto sub-bit line 20A. The potential change on sub-bit line 20A is transmitted onto main bit line 2 through switch circuit 5A. Sub-bit line 30A maintains a precharge potential VD since electric charges of memory cell capacitors 8 are not transmitted onto sub-bit line 30A.

Then, the sense amplifier included in peripheral circuit 18 is brought to an active state, to amplify potential difference between main bit lines 2 and 3 and between sub-bit lines 20A and 30A. In reading operation, the IO gate (included in peripheral circuit 18) is selected in response to a column select signal from a column decoder (not shown), and data amplified by the sense amplifier included in peripheral circuit 18 is transmitted onto internal data bus. In writing operation, write data is transmitted through the internal data bus in this state. The potentials of main bit lines 2 and 3 and sub-bit lines 20A and 30A attain levels corresponding to the write data.

When one memory cycle is completed, the potential of the selected word line 9-1 falls to a low level, and then block select signals φSA and /φSA attain low and high levels, respectively. Sub-bit lines 20A and 30A are again connected to constant voltage VD supply transmission line 4, the potentials of which attain a level of constant voltage VD.

In non-selected memory cell groups (memory cell groups not including the selected word line) 10B to 10N, switch circuits 6B to 6N are in an on state, and switch circuit 5B to 5N are in an off state. The sub-bit lines are maintained at a constant voltage VD level. The sub-bit lines are arranged between cell plate line 52 and main bit lines 2 and 3.

Even when cell plate line 52 is normally supplied with constant cell plate voltage Vcp, sub-bit lines in the non-selected memory cell groups have the potentials retained at constant voltage VD. Therefore, cell plate line 52 is shielded from main bit lines 2 and 3 by those sub-bit lines, resulting in reduction of a parasitic capacitance between main bit lines 2 and 3 and cell plate line 52. Cell plate line 52 is capacitive-coupled mainly with the sub-bit lines. The potential of each of the non-selected sub-bit lines is fixed, reducing capacitive noise of the bit line (sub/main bit lines).

As a semiconductor memory device is made large in storage capacity, the number of memory cells arranged on one column increases. The size of a memory cell becomes small, and a capacitance value of capacitor 8 becomes small accordingly. When a capacitance value of memory cell capacitor 8 becomes small, the amount of electric charges stored therein is decreased, which makes it difficult to provide a sufficient potential change to each of main bit lines 2 and 3. Referring to FIGS. 19A through 20B, the amount of potential change of each of main bit lines 2 and 3 will be found in the following.

Consider the precharge state as shown in FIG. 19A. Assume that a parasitic capacitance of each of main bit lines 2 and 3 is Cmb, and a parasitic capacitance of each of sub-bit lines 20A and 30A is Csb. Assume that a capacitance value of memory cell capacitor 8 is Cs. For facilitation of description, assume that precharge potentials of main bit lines 2, 3 and sub-bit lines 20A, 30A are all VD=Vcc/2 in the precharge state, wherein Vcc denotes an operating power supply voltage. Assume that the cell plate potential Vcp of memory cell capacitor 8 is also equal to Vcc/2.

As is clear from an electric equivalent circuit shown in FIG. 19B, charges Qmb stored in each of main bit lines 2 and 3, charges Qsb stored in each of sub-bit lines 20A and 30A, and charges Qs stored in memory cell capacitor 8 are expressed by:

$$Qmb=VD \cdot Cmb=Vcc \cdot Cmb/2,$$

$$Qsb=VD \cdot Csb=Vcc \cdot Csb/2,$$

$$Qs=(V-Vcp) \cdot Cs=(V-Vcc/2) \cdot Cs$$

where V is a write voltage to a memory cell, and V=Vcc when data at a high level is written, and V=0 when data at a low level is written.

As shown in FIG. 20A, in read operation of memory cell data, sub-bit line 20A is connected to main bit line 2, and memory cell capacitor 8 is connected to sub-bit line 20A. Although sub-bit line 30A is connected to main bit line 3, sub-bit line 30A has no memory cell capacitors connected thereto. In this state, as shown in FIG. 20B, potentials of memory cell capacitor 8, sub-bit line 20A, and main bit line 2 attain a read potential VR. In this state, charges Qmb', Qsb', and Qs' stored in main bit line 2, sub-bit line 20A, and memory cell capacitor 8 are expressed by:

$$Qmb'=VR \cdot Cmb,$$

$$Qsb'=VR \cdot Csb,$$

$$Qs'=(VR-Vcp) \cdot Cs$$

Since the total amount of electric charges does not change between the precharge state and the reading operation of memory cell data, the following expression is obtained based on the principle of conservation of charges:

$$Qmb+Qsb+Qs=Qmb'+Qsb'+Qs',$$

By substituting respective values in the above expression, the following expression is obtained:

$$(Cmb+Csb-Cs) \cdot Vcc/2+V \cdot Cs=(Cmb+Csb+Cs) \cdot VR-Cs \cdot Vcc/2$$

By changing the above expression, the following expression is obtained:

$$VR=\{(Cmb+Csb) \cdot Vcc/2+V \cdot Cs\}/(Cmb+Csb+Cs)$$

The potential of main bit line 3 is at a level of Vcc/2 in the precharge state. Therefore, the potential difference (read voltage) ΔV between main bit lines 2 and 3 in reading data is given by:

$$\Delta V=VR-Vcc/2=\{(V-Vcc/2) \cdot Cs/(Cmb+Csb+Cs)\}$$

A write voltage V of a memory cell in restoring operation or in writing data is Vcc or 0. Therefore, the following expression is obtained:

$$\Delta V=\pm Cs \cdot Vcc/(2 \cdot (Cmb+Csb+Cs)) \qquad (1)$$

The number of memory cells connected to a sub-bit line is smaller as compared to the case of a bit line of an ordinary non-hierarchical structure. In addition, the length of the sub-bit line becomes shorter. Therefore, the parasitic capacitance Csb becomes smaller as compared to the case of a bit line of a non-hierarchical structure. However, main bit lines are provided, and since the main bit lines extend over one entire column, the interconnection capacitance exists. Therefore, it is desired from the standpoint of high integration to increase the read voltage as much as possible even in such a hierarchical bit line structure.

The pitch of a main bit line becomes narrower with high integration. One sub-bit line pair is located for a main bit line pair in the row direction. Since the interval between sub-bit lines is the same as the interval between main bit lines, it is necessary to locate two memory cells between the sub-bit line pair. Therefore, as the pitch of the sub-bit line becomes smaller, it becomes extremely difficult to layout memory cells.

In order to alleviate the pitch condition of the sub-bit line, it is considered to structure the main bit line and the sub-bit lines in interconnection layers at different levels. Also in this case, a switching circuit is required for connecting the sub-bit lines to the main bit line structured in an interconnection layer at a different level. The switching circuit operates in response to a block select signal. From the standpoint of layout, it is preferred to repeat the same pattern in terms of area efficiency, facilitation of layout, and the like. Therefore, it is preferred to locate such a switch for selection of a memory cell group without affecting negatively the repetition pattern in the memory cell array.

SUMMARY OF THE INVENTION

One object of the present invention is to provide a semiconductor memory device including a hierarchical bit line structure in which a read voltage can be increased significantly.

Another object of the present invention is to provide a memory cell array structure whose layout is facilitated significantly.

The semiconductor memory device according to the present invention includes a memory cell array having a plurality of memory cells arranged in rows and columns. Memory cells on each column of the memory cell array are divided into a plurality of groups. Each memory cell includes a transistor, and a capacitor having one electrode connected to the transistor.

The semiconductor memory device according to the present invention further includes a plurality of main bit line pairs arranged corresponding to each column, a plurality of sub-bit lines arranged corresponding to memory cell groups and each having transistors of memory cells of a corresponding memory cell group coupled thereto in each column, and a plurality of cell plate lines arranged corresponding to memory cell groups and each having the other electrodes of capacitors of memory cells of a corresponding memory cell group connected thereto in each column.

The semiconductor memory device according to the present invention further includes a first connecting component responsive to a first group select signal for connecting sub-bit lines of a group selected by the first group select signal to one main bit line of a corresponding main bit line pair, a second connecting component responsive to a second group select signal for connecting a cell plate line corresponding to a group selected by the second group select signal to the other main bit line of the corresponding main bit line pair, a constant voltage transmission signal line for transmitting a constant voltage onto each cell plate line, and a disconnecting component responsive to a third group select signal for disconnecting a cell plate line corresponding to a group selected by the third group select signal from the constant voltage transmission signal line. The first to third group select signals select the same group in each column.

Since one sub-bit line and one cell plate line are only arranged between one main bit line pair in each memory cell group, the pitch condition of the sub-bit line is alleviated significantly.

Only a region for locating one memory cell is required between one main bit line pair in the direction crossing the main bit line. Therefore, it is possible to increase an area occupied by a memory cell in the direction crossing a bit line, facilitating layout of memory cells.

To one main bit line, electric charges stored in one electrode of each of memory cell capacitors are transmitted through the memory cell transistor, the sub-bit line, and the first connecting component. On the other hand, a cell plate line brought to a floating state by the disconnecting component is connected to the other main bit line by the second connecting component. Therefore, the potential of the other main bit line changes in the direction opposite to that of one main bit line, thereby increasing a read voltage significantly.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Embodiment 1]

Figure 1:
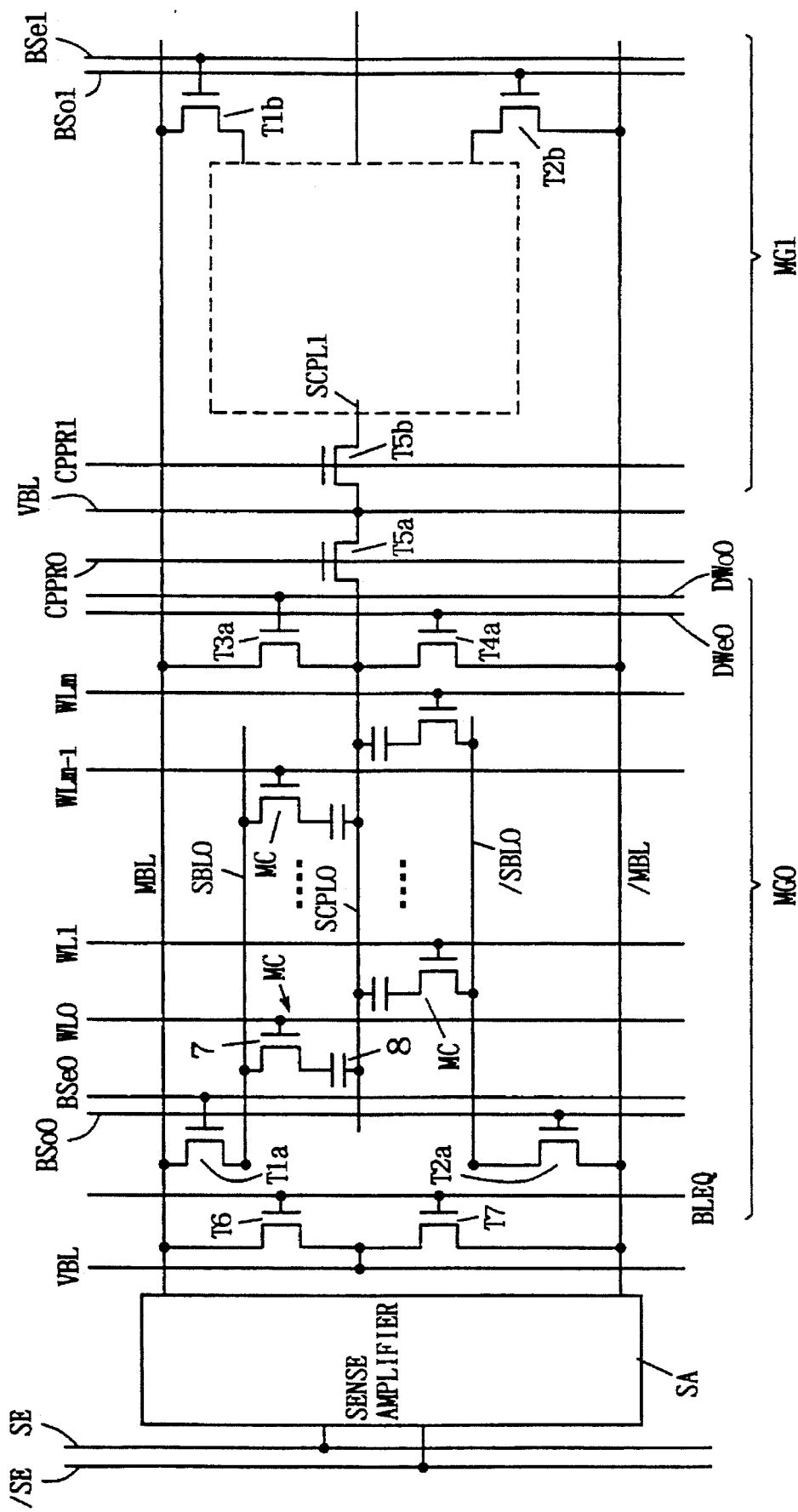
FIG. 1 is a diagram showing a structure of a main portion of a semiconductor memory device according to Embodiment 1 of the present invention.

FIG. 1 is a diagram showing a structure of a main portion of a semiconductor memory device according to Embodiment 1 of the present invention. Only two memory cell groups MG0 and MG1 on one column are shown in FIG. 1.

In FIG. 1, memory cell group MG0 includes a plurality of (m+1) memory cells MC out of memory cells on one column. Each memory cell MC includes capacitor 8 storing information and transistor 7 for accessing the capacitor. Memory cell transistor 7 is coupled to a sub-bit line SBL0 or /SBL0. Capacitor 8 has one electrode connected to one conduction terminal of memory cell transistor 7, and the other electrode connected to a sub-cell plate line SCPL0. Sub-cell plate line SCPL0 receives a constant voltage VBL (Vcc/2, for example) through a switching transistor T5a. Switching transistor T5a is rendered conductive or nonconductive in response to a memory cell group select signal CPPR0.

Word lines WL0 to WLm are arranged corresponding to memory cells MC in the direction crossing main bit lines MBL and /MBL. Word lines WL0 to Wlm are connected to gate electrodes of transistors 7 of memory cells of corresponding rows.

Sub-bit lines SBL0 and /SBL0 are connected to main bit lines MBL and /MBL through switching transistors T1a and T2a rendered conductive in response to group select signals BSe0 and BSo0, respectively.

Group select signals BSe1 and BSo0 include not only memory cell group selection information but also information indicating whether the selected word line is an even-numbered word line or an odd-numbered word line in the memory cell group. For example, when word line WL0 is selected, the number "0" attached to the word line WL0 is an even number. Therefore, group select signal BSe0 is activated. When word line WL1 is selected, the number "1" attached to the word line WL1 is an odd number. Therefore, group select signal BSo0 is activated.

In addition, a switching transistor T3a rendered conductive in response to a group select signal DWo0 is provided between sub-cell plate line SCPL0 and main bit line MBL. A switching transistor T4a rendered conductive in response to a group .select signal DWe0 is provided between sub-cell plate line SCPL0 and main bit line /MBL. Group select signals DWo0 and DWe0 include group selection information and odd number/even number information of a word line, similar to group select signals BSo0 and BSe0.

Main bit lines MBL and /MBL are further provided with a sense amplifier SA activated in response to activation signals SE and /SE for amplifying the potential difference between main bit lines MBL and /MBL, and precharge transistors T6 and T7 transmitting a constant reference voltage VBL (Vcc/2, for example) to main bit lines MBL and MBL in response to an equalize/precharge signal BLEQ.

Figure 2:
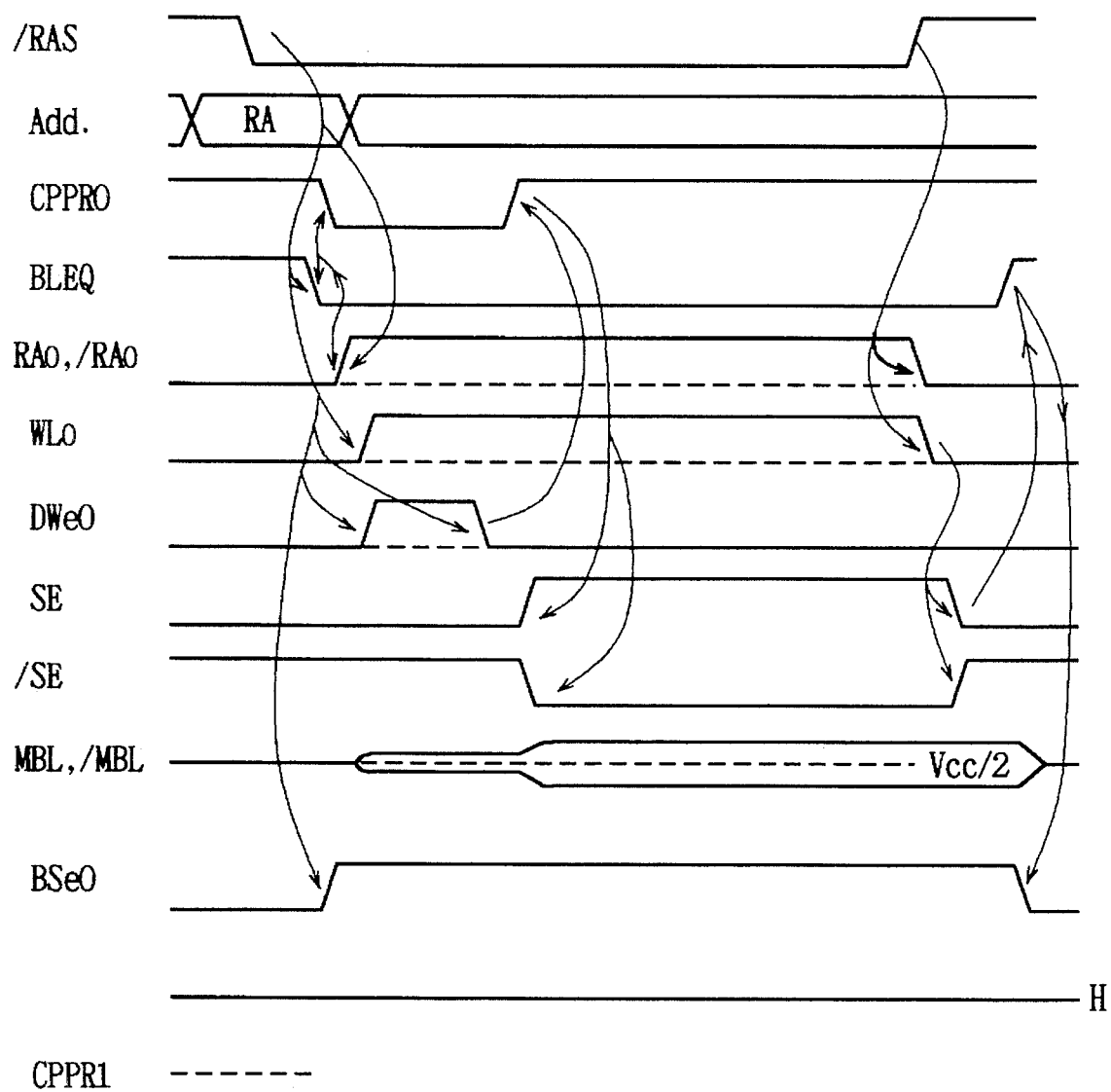
FIG. 2 is a signal waveform diagram showing operation of the semiconductor memory device shown in FIG. 1.

Memory cell group MG1 has a structure similar to that of memory cell group MG0. Constant reference voltage VBL is transmitted to sub-cell plate line SCPL1 through switching transistor T5b rendered conductive in response to a signal CPPR1. Sub-bit lines (not shown) included in memory cell group MG1 are provided with switching transistors T1b and T2b connecting corresponding sub-bit lines to main bit lines MBL and /MBL in response to group select signals BSe1 and BSo1. Operation will now be described with reference to the operational waveform diagram shown in FIG. 2.

In a stand-by state, signals BLEQ, CPPR0, CPPR1 are at an active high level, and the remaining signals are inactive. In this state, main bit lines MBL and /MBL are precharged to constant reference voltage VBL through precharge transistors T6 and T7. Constant reference voltage VBL is transmitted to sub-cell plate lines SCPL0, SCPL1 through transistors T5a and T5b. Sub-bit lines SBL, /SBL are precharged to an intermediate voltage Vcc/2 in the preceding cycle as described later.

A memory cycle starts upon falling of row address strobe signal /RAS to an active low level. In response to the falling of row address strobe signal /RAS, an address signal Add is strobed as a row address RA, and row selection operation according to the row address RA is carried out. In response to the falling of row address strobe signal /RAS, signal BLEQ attains an inactive low level, and main bit lines MBL and /MBL are brought to an electrically floating state. Then, when internal address signals RA0, /RA0 are established according to the row address RA, group select signal CPPR0 attains a low level in response to internal address signals RA0, /RA0. Sub-cell plate line SCPL0 is brought to a floating state at constant reference voltage VBL. It is assumed here that internal row address signals RA0, /RA0 designate word line WL0 in memory cell group MG0.

In response to internal row address signals RA0, /RA0, group select signal BSe0 attains an active high level, and sub-bit line SBL0 is connected to main bit line MBL. A memory cell group is designated by upper bits of a row address signal. An even number/odd number of a selected word line is determined by the least significant bit of the row address signal, for example. At this time, in memory group MG1, signal CPPR1 is at an active high level, and reference voltage VBL is transmitted to sub-cell plate line SCPL1 through switching transistor T5b. Sub-bit line /SBL0 is in a floating state at intermediate potential Vcc/2 since transistor T2a is in an off state.

Then, in response to internal row address signals RA0, /RA0, the potential of word line WL0 rises to a high level. At this time, block select signal DWe0 also attains a high level, and sub-cell plate line SCPL0 is connected to main bit line /MBL through switching transistor T4a. Transistor T3a is in an off state, since signal DWo0 is at a low level. Sub-cell plate line SCPL0 is disconnected from a reference voltage VBL supply source by switching transistor T5a. Therefore, when charges stored in capacitors 8 are transmitted to main bit line MBL from sub-bit line SBL0 through transistor 7 of memory cell MC upon selection of word line WL0, charges opposite in sign to the charges stored in capacitor 8 are transmitted to complementary main bit line /MBL from sub-cell plate line SCPL0 through switching transistor T4a. When memory cell MC (positioned at a crossing point of word line WL0 and sub-bit line SBL0) stores information of a high level, for example, the potential of complementary main bit line /MBL decreases in response to increase of the potential of main bit line MBL. As a result, the potential difference between main bit lines MBL and /MBL, that is, the read voltage, can be increased significantly as compared to the conventional structure. The operation of charge transportation will be described in detail later. In brief, a memory capacitor is coupled to main bit lines in a floating state, and the potential difference between main bit lines is increased by the coupling capacitance.

Group select signal DWe0 falls to a low level after a predetermined time period, and switching transistor T4a is brought to an off state, resulting in disconnection of sub-cell plate line SCPL0 from main bit line /MBL. In response to this, group select signal CPPR0 rises to a high level, and constant reference voltage VBL is transmitted to sub-cell plate line SCPL0 through switching transistor T5a.

Then, sense amplifier activation signals SE and /SE attain an active high level and an active low level, respectively. The potential difference between main bit lines MBL and /MBL is amplified by sense amplifier SA.

After writing or reading of data, the signal /RAS rises to an inactive high level. Internal row address signals RA0, /RA0 are brought to an inactive state. The potential of selected word line WL0 attains a low level, and then sense amplifier activation signals SE and /SE also become inactive.

After sense amplifier activation signals SE and /SE become inactive, precharge signal BLEQ attains a high level, and the potentials of main bit lines MBL and /MBL return to a level of constant reference voltage VBL (= Vcc/2). Since group select signal BSe0 is still at a high level, sub-bit line SBL0 is precharged to reference voltage VBL at an intermediate potential through precharge transistor T6 and main bit line MBL. After completion of precharging, group select signal BSe0 falls to an inactive low level, and sub-bit line SBL0 is disconnected from main bit line MBL. By the above-described series of operation, one memory cycle is completed.

Description will now be made of an amount of increase of the read voltage.

Figure 3A:
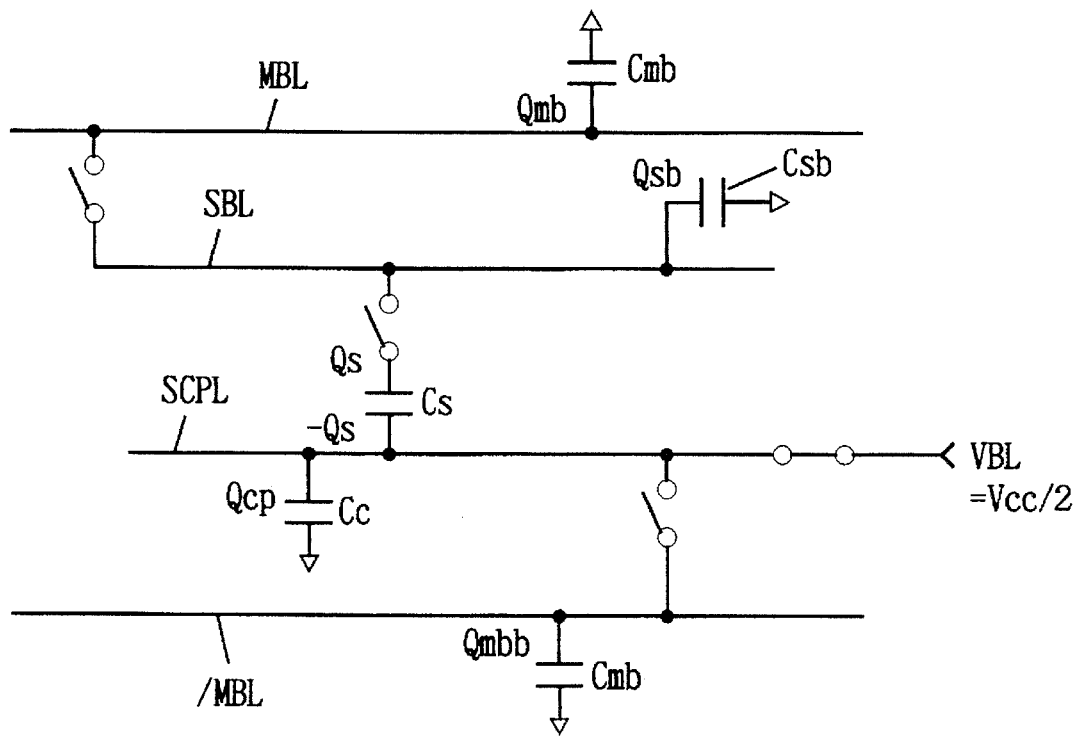
FIGS. 3A, 3B schematically show operation of the semiconductor memory device shown in FIG. 1.
Figure 3B:
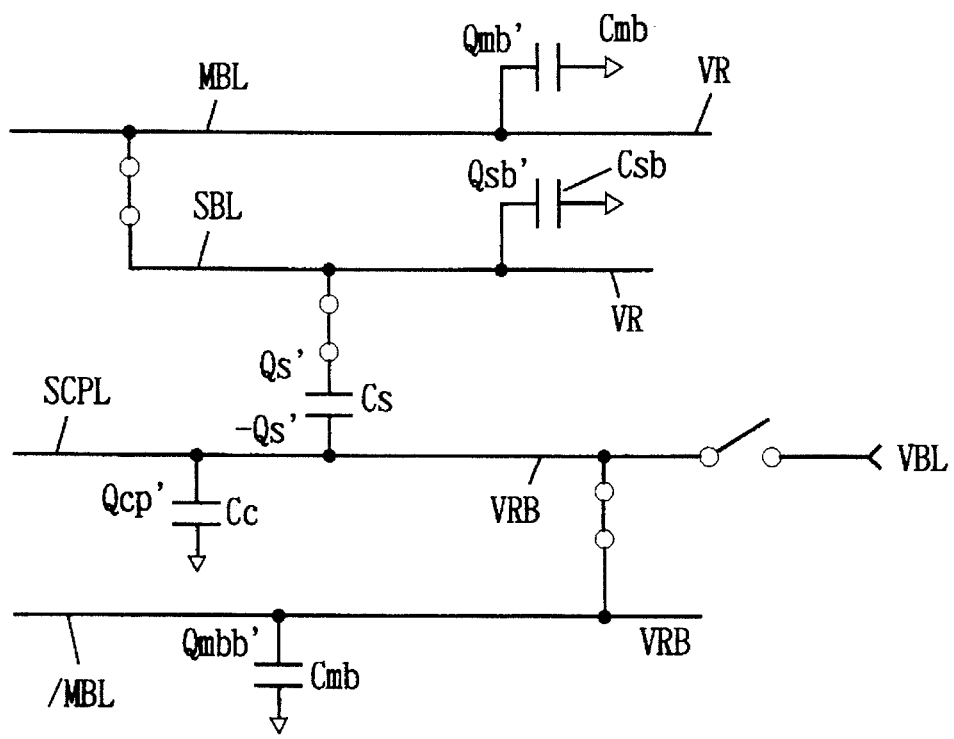

As shown in FIGS. 3A and 3B, assume that a parasitic capacitance of each of main bit lines MBL and /MBL is Cmb, a parasitic capacitance of sub-bit line SBL is Csb, a parasitic capacitance of sub-cell plate line SCPL is Cc, and a capacitance of a memory cell capacitor is Cs. At stand-by shown in FIG. 3A, charges stored in respective capacitances are expressed by:

$$Qmb=Qmbb=Vcc\cdot Cmb/2,$$

$$Qsb=Vcc\cdot Csb/2,$$

$$Qs=(V-Vcc/2)\cdot Cs,$$

$$Qcp=Vcc\cdot Cc/2.$$

In the expressions, Qmb and Qmbb denote charges stored in the parasitic capacitances of main bit lines MBL and /MBL. Qsb denotes charges stored in the parasitic capacitance of sub-bit line SBL. Qs denotes charges stored in a storage node of the memory cell capacitor. V denotes the write voltage of memory cell capacitor Cs. More specifically, V= Vcc or 0.

As shown in FIG. 3B, immediately after selection of a word line, sub-cell plate line SCPL is disconnected from reference voltage VBL (=Vcc/2), and connected to complementary main bit line /MBL. Sub-bit line SBL is connected to main bit line MBL. Charges stored in respective capacitances at this time are expressed by:

$$Qmb'=VR\cdot Cmb,$$

$$Qsb'=VR\cdot Csb,$$

$$Qs'=(VR-VRB)\cdot Cs,$$

$$Qcp'=VRB\cdot Cc,$$

$$Qmbb'=VRB\cdot Cmb.$$

In the above expressions, Qmb' denotes charges stored in the parasitic capacitance of main bit line MBL. Qsb' denotes charges stored in the parasitic capacitance of sub-bit line SBL. Qs' denotes charges stored in the storage node of a memory cell capacitor. Qcp' denotes charges stored in a parasitic capacitance of a cell plate line. Qmbb' denotes charges stored in a parasitic capacitance of complementary main bit line /MBL. VR and VRB denote potentials of main bit lines MBL and /MBL.

Since sub-bit line SBL and sub-cell plate line SCPL are isolated in a direct current sense by a memory cell capacitor, charges do not migrate between them. Only an amount of charges in the cell plate changes according to change of charges stored in storage nodes of memory cell capacitors 8. Therefore, the following expressions are obtained based on the principle of conservation of charge:

$$Qmb+Qsb+Qs=Qmb'+Qsb'+Qs',$$

$$Qmbb+Qcp-Qs=Qmbb'+Qcp'-Qs'$$

Based on these expressions, the following expressions are obtained:

$$(Vcc\cdot Cmb/2)+(Vcc\cdot Csb)/2+(V-Vcc/2)\cdot Cs=VR\cdot Cmb+VR\cdot Csb+(VR-VRB)\cdot Cs,$$

$$(Vcc\cdot Cmb)/2+(Vcc\cdot Cc)/2-(V-Vcc/2)\cdot Cs=VRB\cdot Cmb+VRB\cdot Cc-(VR-VRB)\cdot Cs.$$

Voltage V is Vcc/2 or 0. Therefore, based on the above two expressions, the potential difference $\Delta V=|VR-VRB|$ between main bit lines is given by:

$$\Delta V = \frac{Cs\cdot Vcc}{2} \cdot \frac{1}{\frac{(Cmb+Csb)(Cmb+Cc)}{(2Cmb+Csb+Cc)}+Cs}$$

If parasitic capacitance Cc of sub-cell plate line SCPL is approximately equal to parasitic capacitance Csb of sub-bit line SBL, the following expression is obtained:

$$\Delta V = \frac{Cs\cdot Vcc}{2} \cdot \frac{1}{\frac{(Cmb+Csb)}{2}+Cs} \quad (2)$$

Therefore, since a coefficient to the term (Cmb+Csb) of a denominator is ½ of that in the read voltage ΔV in the case of the conventional hierarchical bit line structure discussed previously, the difference between read potentials is significantly increased.

Only electrodes of the capacitors are connected to sub-cell plate line SCPL, and the sources and drains of the transistors are not connected thereto. Therefore, a junction capacitance does not exist on the sub-cell plate line, and the parasitic capacitance of the sub-cell plate line is smaller than the parasitic capacitance of the sub-bit line. Therefore, a difference between read potentials larger than that expressed by the expression (2) actually appears.

Figure 4A:
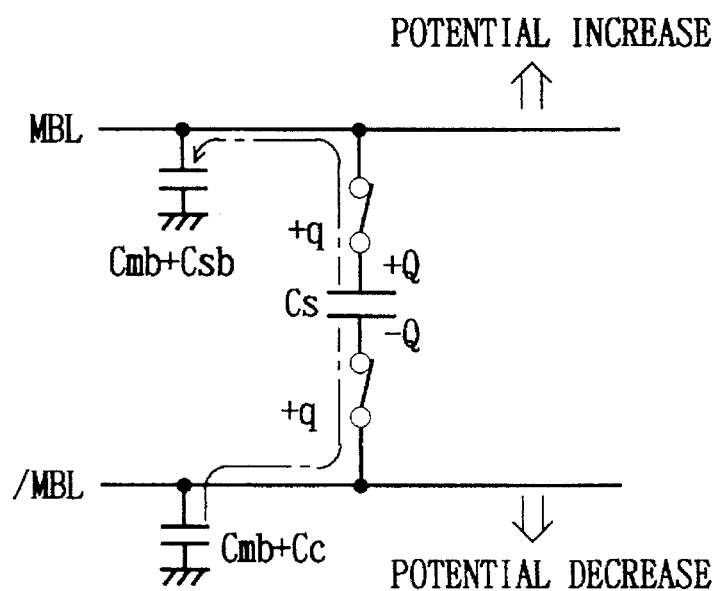
FIGS. 4A, 4B are diagrams for explaining migration of electric charges between main bit lines in the semiconductor memory device shown in FIG. 1.
Figure 4B:
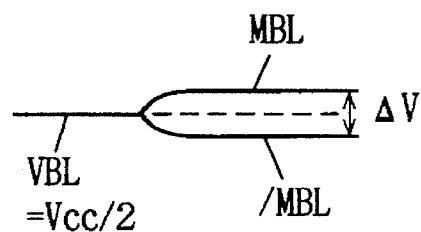

FIGS. 4A and 4B show a state of migration of charges upon reading when a voltage at a high level is written in a memory cell capacitor. In FIG. 4A, when memory cell capacitor Cs is connected to main bit line MBL, charges+q which are a part of charges+Q stored in memory cell capacitor Cs migrate to parasitic capacitances Cmb+Csb of sub-bit line SBL and main bit line MBL. As a result, the potential of main bit line MBL increases as shown in FIG. 4B.

On the other hand, the cell plate electrode of memory cell capacitor Cs is connected to main bit line /MBL through the sub-cell plate line. In order to compensate for flow-out loss of charges+q from memory cell capacitor Cs to main bit line MBL, charges+q flow in the cell plate electrode of memory cell capacitor Cs from parasitic capacitances Cmb+Csb of complementary main bit line /MBL and sub-cell plate line SCPL. As a result, the potential of main bit line /MBL falls.

As shown in FIG. 4B, the difference ΔV between read potentials of main bit lines MBL and /MBL is significantly increased as compared to the case where a cell plate potential is fixed, as shown in FIG. 4B. When the cell plate potential is fixed, the potential of main bit line MBL maintains precharge potential VBL (=Vcc/2). Therefore, the potential of main bit line /MBL maintains a potential indicated by a broken line shown in FIG. 4B.

Figure 5A:
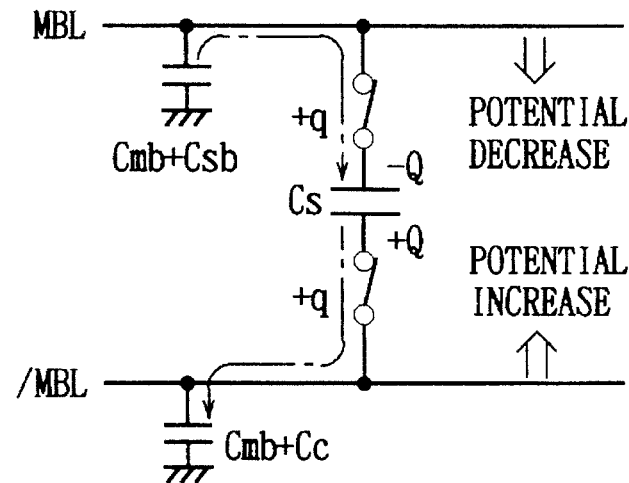
FIGS. 5A, 5B are diagrams for explaining migration of electric charges between main bit lines in the semiconductor memory device shown in FIG. 1.
Figure 5B:
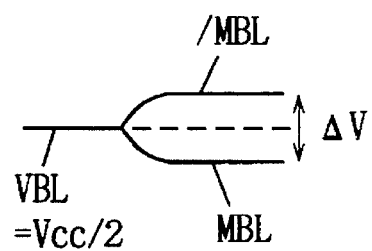

FIGS. 5A and 5B show a state of migration of charges upon reading of data when a voltage at a low level is written in memory cell capacitor Cs. As shown in FIG. 5A, when memory cell capacitor Cs is connected to sub-bit line SBL and main bit line MBL, charges+q of charges stored in parasitic capacitances Cmb+Csb of main bit line MBL and sub-bit line SBL flow in memory cell capacitor Cs. As a result, the potential of main bit line MBL becomes lower than the precharge potential VBL.

On the other hand, the cell plate electrode of memory cell capacitor Cs is connected to complementary main bit line /MBL through the sub-cell plate line. Therefore, in order to be balanced with charges+q flowing in memory cell capacitor Cs from main bit line MBL and sub-bit line SBL, charges+q flow out to main bit line /MBL and the sub-cell plate line from the cell plate electrode of memory cell capacitor Cs. As a result, the potential of complementary main bit line /MBL increases. Therefore, as shown in FIG. 5B, the potential difference ΔV between complementary main bit line /MBL and main bit line MBL is increased.

The sense amplifier is activated with the sub-cell plate line disconnected from the main bit line and connected to fixed potential VBL. As a result, the sense amplifier can reliably amplify data read out without malfunction. In sense amplifying operation, the cell plate line is disconnected from main bit line /MBL, and is supplied with fixed potential VBL. Therefore, the voltage applied between electrodes of memory cell capacitor Cs is Vcc/2 at maximum, and the dielectric breakdown characteristic of the memory cell capacitor is reliably guaranteed.

[Embodiment 2]

Figure 6:
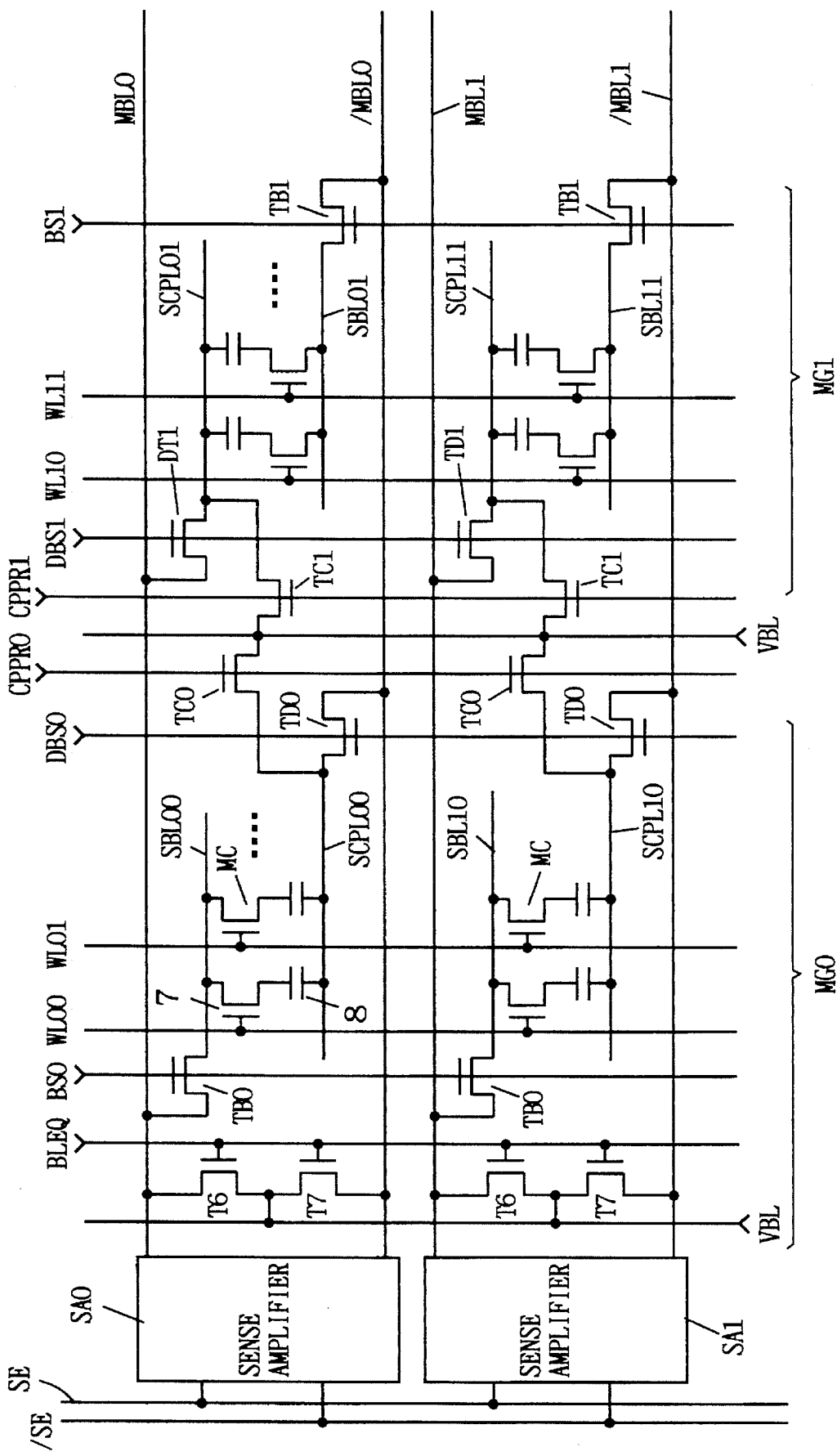
FIG. 6 is a diagram showing a structure of a main portion of a semiconductor memory device according to Embodiment 2 of the present invention.

FIG. 6 is a diagram showing a structure of a main portion of a semiconductor memory device according to Embodiment 2 of the present invention. In FIG. 6, shown is a structure of a portion of two memory cell groups MG0 and MG1 out of memory cells arranged on two columns.

Referring to FIG. 6, in memory cell group MG0, sub-bit line SBL00 and sub-cell plate line SCPL00 are arranged between main bit lines MBL0 and /MBL0. One conduction electrode node of each of transistors 7 of memory cells MC is connected to sub-bit line SBL00. The cell plate electrode of each of memory cell capacitors 8 is connected to sub-cell plate line SCPL00. Sub-bit line SBL00 is provided at one end with a switching transistor TB0 rendered conductive in response to a group select signal BS0 and connecting sub-bit line SBL00 to main bit line MBL0.

Sub-cell plate line SCPL00 is provided at an end portion on the side opposite to the region where switching transistor TB0 is arranged with a switching transistor TD0 rendered conductive in response to a second group select signal DBS0 and connecting sub-cell plate line SCPL00 to complementary main bit line /MBL0. In parallel with switching transistor TD0, a switching transistor TC0 is provided which is rendered conductive in response to a third group select signal CPPR0 and transmits constant reference voltage VBL (=Vcc/2) to sub-cell plate line SCPL00. By providing switching transistor TB0 and switching transistors TD0 and TC0 in the regions opposite to each other, the pitch condition of each transistor in the direction crossing a bit line is alleviated.

Also in memory cell group MG1, sub-bit line SBL01 and sub-cell plate line SCPL01 are provided between main bit lines MBL0 and /MBL0. Sub-cell plate line SCPL01 is connected to main bit line MBL0 through switching transistor TD1 rendered conductive in response to first group select signal DBS1. Sub-bit line SBL01 is connected to complementary main bit line /MBL0 through switching transistor TB1 in response to first group select signal BS1 in a region opposite to the region where switching transistor TD1 is provided.

Sub-cell plate line SCPL01 receives reference voltage VBL through switching transistor TC1 rendered conductive in response to third group select signal CPPR1. Switching transistors TC0 and TD0, and switching transistors TC1 and TD1 are arranged in a point symmetry fashion. As a result, a pattern layout is facilitated.

Main bit lines MBL0 and /MBL0 are further provided with a sense amplifier SA0 activated in response to sense amplifier activation signals SE and /SE for amplifying the potential difference between main bit lines MBL0 and /MBL0, and precharge transistors T6 and T7 transmitting constant fixed reference voltage VBL to main bit lines MBL0 and /MBL0 in response to precharge signal BLEQ.

Similar components as those of main bit lines MBL0 and /MBL0 are also provided for main bit lines MBL1 and MBL1. Sub-bit line SBL10, sub-cell plate line SCPL10, sub-cell plate line SCPL11, and sub-bit line SBL11 are located for memory cell groups MG0 and MG1. Switching transistors connecting the main bit lines and the sub-bit lines and the sub-cell plate line are labeled with the same reference characters, since these transistors are rendered conductive, on the basis of a memory cell group, in response to first, second and third group select signals BS, DBS and CPPR.

In the arrangement shown in FIG. 6, if sub-bit lines SBL and sub-cell plate lines SCPL alternately located in the column direction are fabricated in interconnection layers at different levels, the pitch condition in the column direction (the direction in which the main bit line extends) can be alleviated. It is possible to provide a sufficient region of forming a switching transistor provided for the sub-cell plate line. Due to the multi-level interconnection structure, a higher densitization of components can be implemented as compared to the case where interconnection layers at the same level are provided successively in the column direction. It is possible to decrease an occupation area in the column direction.

Since only one sub-bit line SBL and only one sub-cell plate line SCPL are arranged between main bit lines MBL and /MBL in one memory cell group, the pitch condition of sub-bit line SBL is significantly alleviated.

In addition, since one memory cell is arranged between the main bit lines in the direction in which a word line extends, the pitch condition of a memory cell in the word line extending direction can be alleviated. It is possible to locate memory cells with a sufficient margin.

Word line WL is placed corresponding to transistors of memory cells on one row. Word lines WL00, . . . are arranged for memory cell group MG0, and word lines WL10, . . . are arranged for memory cell group MG1. Since switching transistors TB, TD and TC can be controlled of on/off state based on whether the selected word line selects memory cells in a corresponding memory cell group or not, operation control of the switching transistor is simplified.

By alternately arranging sub-bit lines and sub-cell plate lines in the column direction, the parasitic capacitance due to a coupling capacitance between a main bit line, and the sub-bit line and the sub-cell plate line is made equal for a true main bit line MBL and for the complementary main bit line /MBL, resulting in stable sensing operation. Operation will now be described with reference to the operational waveform diagram shown in FIG. 7.

When row address strobe signal /RAS is at a high level, the semiconductor memory device is in a precharge state, in which precharge signal BLEQ is at a high level, and in which precharge transistors T6 and T7 are in an on state. In this state, main bit lines MBL0, /MBL0, MBL1, and /MBL1 are precharged to a predetermined reference potential VBL (=Vcc/2). Sub-bit lines SBL00, . . . are also in a precharge state at the potential VBL.

When row address strobe signal /RAS is activated to attain a low level, a memory cycle of the semiconductor memory device starts. In response to the falling of row address strobe signal /RAS, address signal Add is strobed as row address RA, and an internal address signal is generated. At this time, precharge signal BLEQ attains an inactive low level in response to the activation of row address strobe signal /RAS, and main bit lines MLB0, /MBL0, MLB1, /MBL1 are brought to a floating state at the precharge potential VBL.

According to row address signal RA, a memory cell block is first determined (by decoding a predetermined number of upper bits of the row address signal), and a group select signal corresponding to the selected memory cell group is generated.

When memory cell group MG0 is selected, group select signal CPPR0 is first brought to an inactive state at a low level, and switching transistor TC0 is brought to an off state. As a result, in memory cell group MG0, sub-cell plate lines SCPL00, SCPL10 are brought to a floating state at the reference potential VBL.

Then, group select signal BS0 is activated, and sub-bit lines SBL00, SBL10 are connected to main bit lines MBL0 and MBL1 through switching transistor TB0.

After sub-cell plate lines SCPL00, SCPL10 are brought to a floating state, group select signal DBS0 attains a high level for a predetermined time period, and sub-cell plate lines SCPL00 and SCPL10 are connected to complementary main bit lines /MBL0 and /MBL1, respectively. In this state, since sub-cell plate line SCPL, sub-bit line SBL, and main bit lines MBL, and /MBL all maintain predetermined potential VBL, charges do not migrate.

Figure 7:
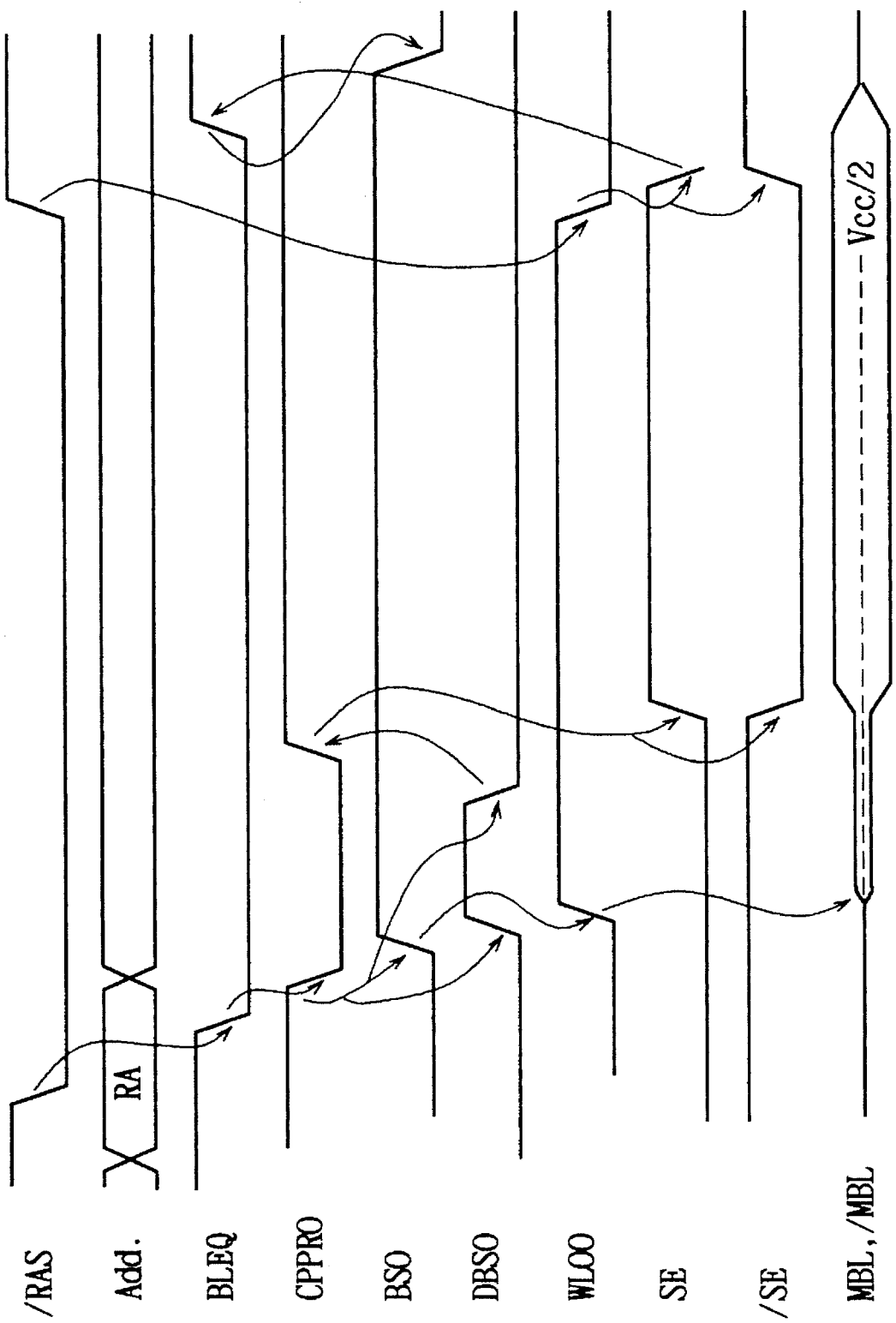
FIG. 7 is a signal waveform diagram showing operation of the semiconductor memory device shown in FIG. 6.

Then, a word line is selected according to row address signal RA, and the potential of the selected word line rises to a high level. FIG. 7 shows the state where word line WL00 is selected. When word line WL00 is selected, charges migrate between a capacitor of a memory cell connected to the selected word line WL00 and main bit line MBL. In response to migration of charges between memory cell capacitors 8 and main bit line MBL, charges migrate in a complementary manner between complementary main bit line /MBL and the other electrode of memory cell capacitor 8.

Depending on the amount of charges stored in memory cell capacitor connected to the selected word line, the potential of one main bit line of main bit line pair MBL and /MBL increases, and the potential of the other main bit line decreases. When the potential difference between main bit lines MBL (MBL0, MBL1) and /MBL (/MLB0, /MBL1) is sufficiently increased, second group select signal DBS0 falls to a low level, and switching transistor TD0 is brought to an off state. As a result, sub-cell plate lines SCPL00 and SCPL10 are disconnected from complementary main bit lines /MBL0 and /MBL1.

When second group select signal DBS0 is deactivated (attains a low level), third group select signal CPPR0 attains a high level, and reference voltage VBL is transmitted to sub-cell plate lines SCPL00, SCPL10 through switching transistor TC0. As a result, the potential of each of sub-cell plate lines SCPL00 and SCPL10 is fixed to constant cell plate potential VBL.

When sense amplifier activation signals SE and /SE are activated and attain a high level and a low level, respectively, the potential difference between main bit lines MBL (MBL0, MBL1) and /MBL (/MLB0, /MBL1) is amplified. Sense amplifiers SA0, SA1, . . . are activated after sub-cell plate lines SCPL00, SCPL10 are fixed to reference voltage VBL by the signal CPPR0 because of the following reason. In the selected memory cell group MG0, storage nodes (connection points between capacitors 8 and transistors 7) of non-selected memory cells (memory cells connected to non-selected word lines) are in a floating state. In this case, the potential of each of storage nodes of non-selected memory cells changes according to potential change of the sub-cell plate line (due to capacitive coupling). In order to prevent destruction of information stored in the non-selected memory cells, sense amplifiers are activated after sub-cell plate lines SCPL00, SCPL10 are disconnected from complementary main bit lines /MBL0 and /MBL1, and fixed to constant potential VBL. By recharging of the sub-cell plate lines, changed potential of each of storage nodes of non-selected memory cells upon connection of the main bit line and the sub-cell plate line is recovered to a potential level corresponding to stored data. As a result, a reliable data retention characteristic is guaranteed.

In non-selected memory cell group MG1, all the components maintain the precharge state, and the sub-cell plate lines are supplied with constant reference voltage VBL.

Also in the structure of the embodiment shown in FIG. 6, the read potential difference of a magnitude similar to that of Embodiment 1 described previously is generated. Even if the memory cell capacitor is made small, or even if a ratio of a capacitance of the memory cell capacitor to parasitic capacitances of the sub-bit line and the main bit line becomes smaller, it is possible to obtain a sufficient read potential difference, resulting in reliable sensing operation.

In a timing chart shown in FIG. 7, after the sub-cell plate line is brought to a floating state, sub-bit line SBL is connected to main bit line MBL, and then sub-cell plate line SCPL is connected to complementary main bit line /MBL. However, as far as the condition that a sub-cell plate line is in a floating state upon selection of a word line (upon rising of a potential of the selected word line) is satisfied, these lines may be connected in a different timing relation (in which the sub-cell plate line is brought to a floating state after the sub-cell plate line is connected to complementary main bit line /MBL, for example).

When one memory cycle is completed, row address strobe signal /RAS rises to a high level, and the potential of selected word line WL00 falls to a low level. In response to this, sense amplifier activation signals SE and /SE transition to an inactive low level and an inactive high level. Then, precharge signal BLEQ rises to a high level, and precharges main bit lines MBL and /MBL to a predetermined reference potential VBL. At this time, first group select signal BS0 is still at a high level. Therefore, sub-bit line SBL0 is precharged to the predetermined reference potential VBL through main bit line MBL.

After a predetermined time period, first group select signal BS0 falls to a low level, and sub-bit line SBL0 is disconnected from main bit line MBL.

A structure may be used in which group select signals BS, DBS and CPPR are all at a high level at stand-by and group select signals DBS and BS for the non-selected memory blocks are brought to an inactive low level in a memory access cycle.

Figure 8:
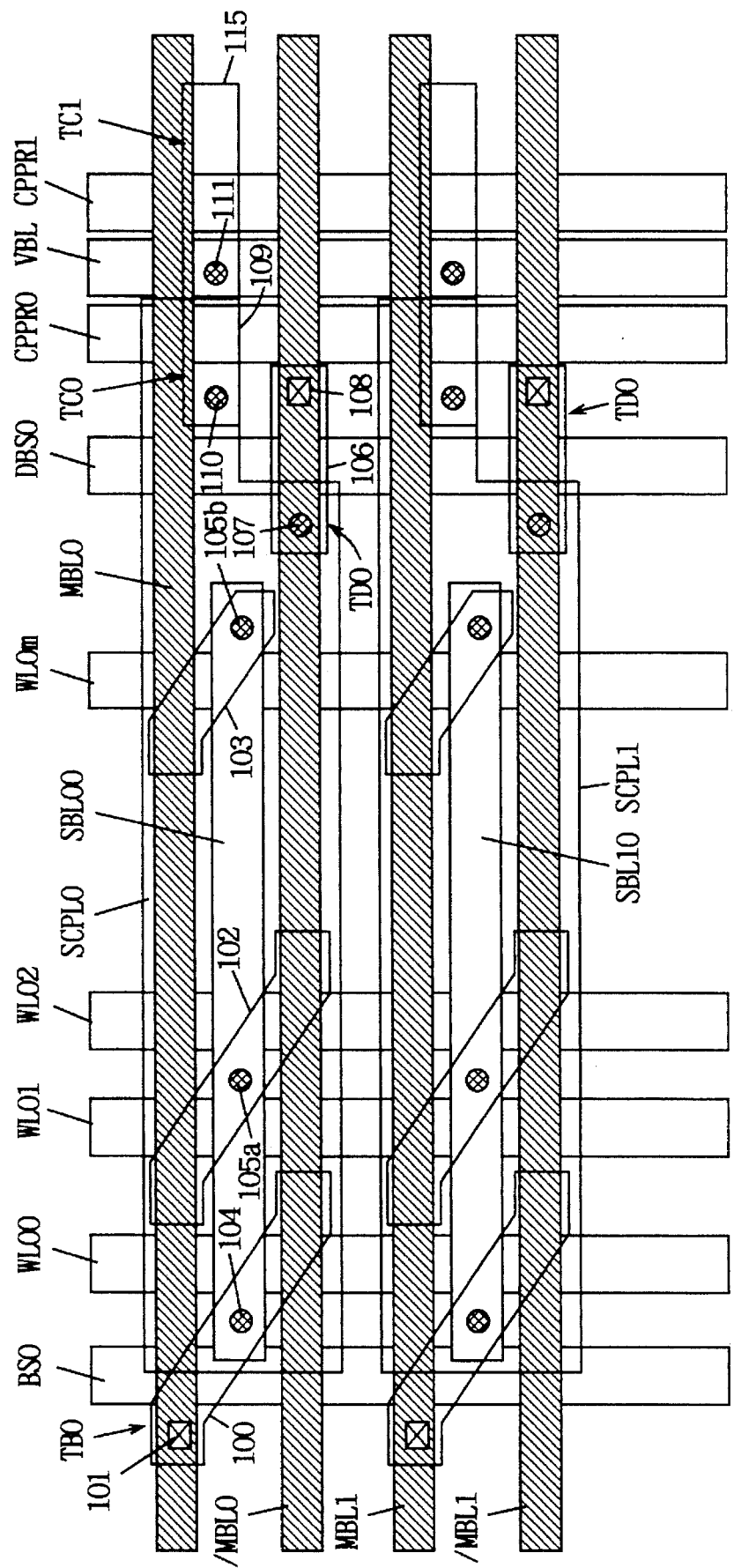
FIG. 8 is a diagram showing a plan layout of the semiconductor memory device shown in FIG. 6.

FIG. 8 is a diagram showing a plan layout of a portion of memory cell group MG0 shown in FIG. 6. In FIG. 8, main bit lines MBL0, /MBL0, MBL1, and /MBL1 formed of low resistance conductive layers are arranged in parallel with each other in the column direction (the horizontal direction in FIG. 8). Between main bit lines MBL0 and MBL0, sub-bit line SBL00 formed of a low resistance polysilicon layer, for example, is arranged in parallel therewith. Between main bit lines MBL1 and /MBL1, sub-bit line SBL10 is arranged in parallel therewith.

Main bit lines (MBL0, /MBL0, MBL1 and /MBL1) and sub-bit lines (SBL00 and SBL10) are formed in interconnection layers at different levels. Due to a multi-level interconnection structure, sub-bit lines can be arranged with a sufficient margin, even if a pitch between main bit lines is made small. Since only one sub-bit line is provided for two main bit lines, it is possible to arrange a sub-bit line between main bit lines with a sufficient margin.

In the direction orthogonal to main bit lines MLB0, /MBL0, MBL1, and /MBL1, arranged are a group select signal line BS0 (a signal line and a signal transmitted thereon are denoted by the same reference character), word lines WL00 to WL0m, a second group select signal line DBS0, third group select signal lines CPPR0, CPPR1, and a constant reference voltage transmission signal line VBL.

Interconnection layer VBL is formed at the same level as the interconnection layer of sub-bit line SBL. Signal lines BS0, CPPR0, CPPR1, and word lines WL00 to WL0m are formed in interconnection layers at the same level. By forming signal line VBL and signal lines CPPR0 and CPPR1 in interconnection layers at different levels, an occupation area in this region is reduced, and the layout is facilitated.

Active regions 100, 102, . . . , 103 are arranged between main bit lines MBL0 and /MBL0. Active regions 100 to 103 are formed obliquely with respect to main bit lines MBL0 and /MBL0. The active regions are regions of forming transistors and memory cells. Even if a pitch of main bit lines becomes small, it is possible to form a transistor and a memory cell of a sufficient large size. By forming active regions obliquely as described above, it is possible to make smaller a pitch of memory cells in the bit line extending direction. Memory cells can be arranged in a high density (a pitch of the word lines can be made smaller).

Under main bit lines MBL0 and /MBL0, sub-cell plate line SCPL0 is arranged to receive reference voltage VBL from signal line VBL and to cover the memory cell region. As for main bit lines MBL1 and /MBL1, sub-cell plate line SCPL1 is similarly formed in parallel with main bit lines MBL1 and /MBL1. Sub-cell plate lines SCPL0 and SCPL1 are isolated from each other.

Active region 100 is connected to main bit line /MBL0 through a contact hole 101 at one end, and connected to sub-bit line SBL00 through a contact hole 104 at the center region. The signal line BS0 is arranged between contact holes 101 and 104. A region between contact holes 101 and 104 provides switching transistor TB0 for group selection. A region extending under main bit line /MBL0 from contact hole 104 of active region 100 forms a memory cell. A region 100 parallel with main bit line /MBL0 in active region forms a storage node of a memory cell which in turn forms a memory cell capacitor with sub-cell plate line SCPL0.

Active region 102 is connected to sub-bit line SBL00 through a contact hole 105a at the center region. In active region 102, a memory cell to be selected by word line WL01 and a memory cell to be selected by word line WL02 are formed. Due to the sharing of one contact hole 105a by two memory cells, two memory cell transistors can share one conduction region. By reducing an occupation area of a memory cell, a memory cell array highly densitized can be implemented. Also in active region 102, a region in parallel with main bit lines MBL0 and /MBL0 provides a storage node.

Active region 103 is connected to sub-bit line SBL00 through contact hole 105b. Active region 103 provides a memory cell to be selected by word line WL0m. In active region 103, only one memory cell is formed. More specifically, in memory cell group MG0, an even number of memory cells are connected to one sub-bit line SBL.

An active region 109 is formed in parallel with main bit line MBL0 and overlapping with sub-cell plate line SCPL0 in a planar view. Active region 109 is connected to sub-cell plate line SCPL0 through a contact hole 110, and connected to signal line VBL through a contact hole 111. Active region 109 forms switching transistor TC0 turned on/off in response to signal CPPR0.

Contact hole 111 is also shared by an active region 115. Active region 115 provides switching transistor TC1 rendered conductive in response to a signal on signal line CPPR1.

An active region 106 is formed in parallel with main bit line /MBL0 and overlapping therewith in a planar view. Active region 106 is connected to sub-cell plate line SCPL0 through a contact hole 107 at one end, and connected to main bit line /MBL0 through another contact hole 108 at the other end. Signal line DBS0 is arranged between contact holes 107 and 108. Active region 106 provides switching transistor TD0 turned on/off in response to group select signal DBS0.

By forming active regions 106 and 109 in parallel with the direction in which main bit lines MBL and /MBL extend, it is possible to form switching transistors TC0 and TD0 of a desired size with a sufficient margin.

As for main bit lines MBL1 and /MBL1, the similar layout as that of main bit lines MBL0 and /MBL0 is applied.

As is clearly seen from FIG. 8, in a memory cell array portion, the same pattern appears in a repetitive manner. Therefore, layout of a memory cell array is facilitated. Since the sub-bit line and the sub-cell plate line are formed in interconnection layers at different levels, one sub-bit line SBL and one sub-cell plate line SCPL have only to be provided for a pair of main bit lines MBL and /MBL. It is possible to form these lines with a sufficient margin.

Figure 9:
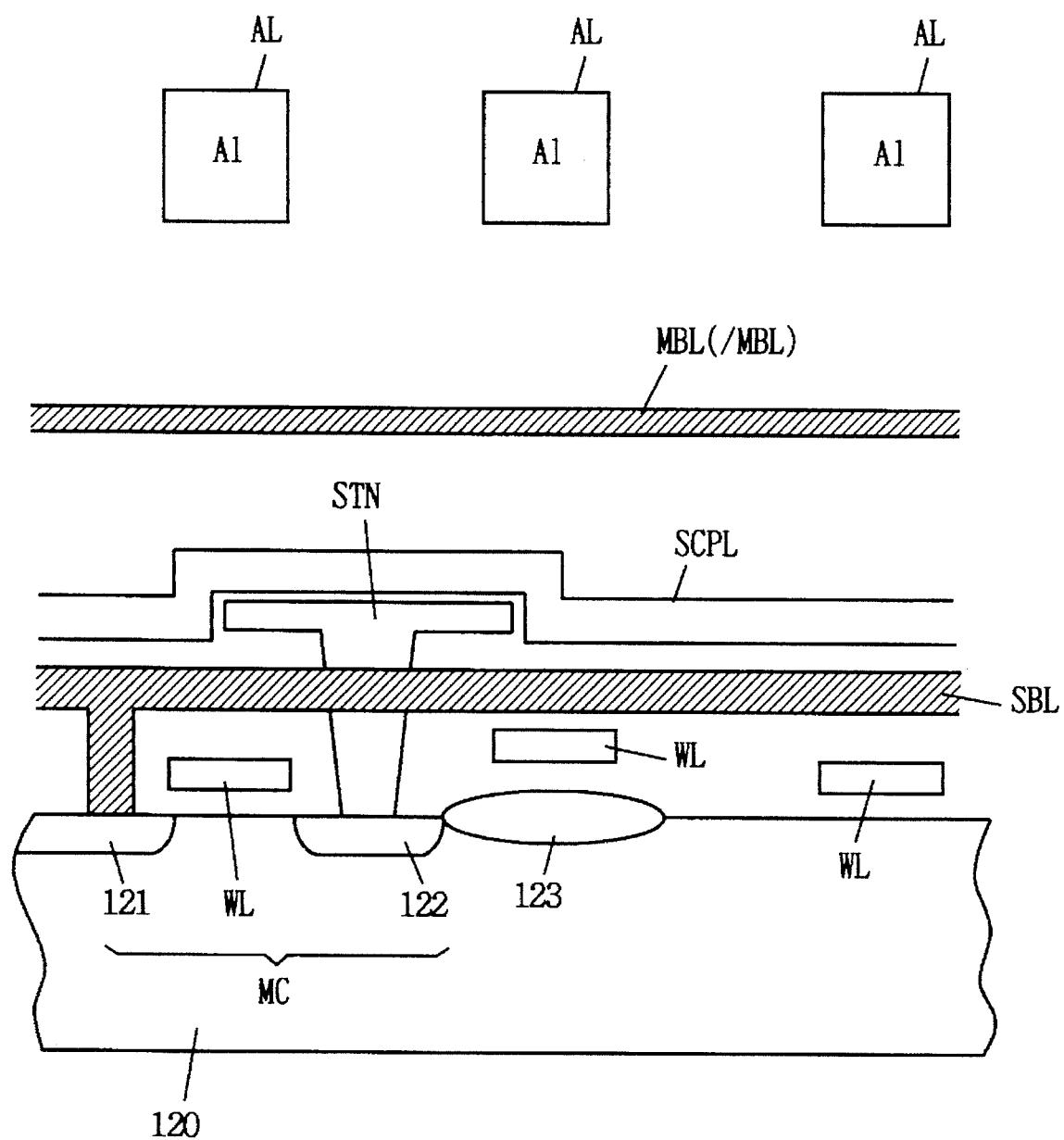
FIG. 9 is a diagram showing a schematic sectional structure of a main portion of the semiconductor memory device shown in FIG. 6.

FIG. 9 is a diagram showing schematically a sectional structure of a memory cell array portion. In FIG. 9, main bit line MBL (/MBL), sub-cell plate line SCPL, and sub-bit lien SBL are arranged in parallel with each other in interconnection layers at different levels. Sub-bit line SBL is connected to an impurity region 121 formed on the surface of a bulk (well region or substrate region). Word line WL is formed in the direction crossing these main bit line MBL (/MBL), sub-cell plate line SCPL, and sub-bit line SBL. A storage node STN is formed under a region which is a part of sub-cell plate line SCPL. Storage node STN is connected to an impurity region 122 formed on the surface of a bulk 120. A region in which storage node STN and the sub-cell plate line are faced to each other in an active region portion formed in parallel with main bit line MBL (/MBL) in the layout shown in FIG. 8. Therefore, memory cell MC has a stacked capacitor cell structure. Adjacent memory cells are isolated from each other by a field insulating film 123.

A conductive layer AL formed of a low resistance material such as aluminum is arranged in parallel with word line WL above main bit line MBL (/MBL). Low resistance conductive layer AL and word line WL are electrically connected to each other at predetermined intervals. By this structure, an effective resistance of word line WL formed of a polysilicon layer, for example, is reduced. As for signal lines BS0, DBS0, CPPR0, CPPR1, a "shunt structure" (structure in which a line is connected to a low resistance conductive layer at a predetermined interval) may be similarly used.

Figure 10:
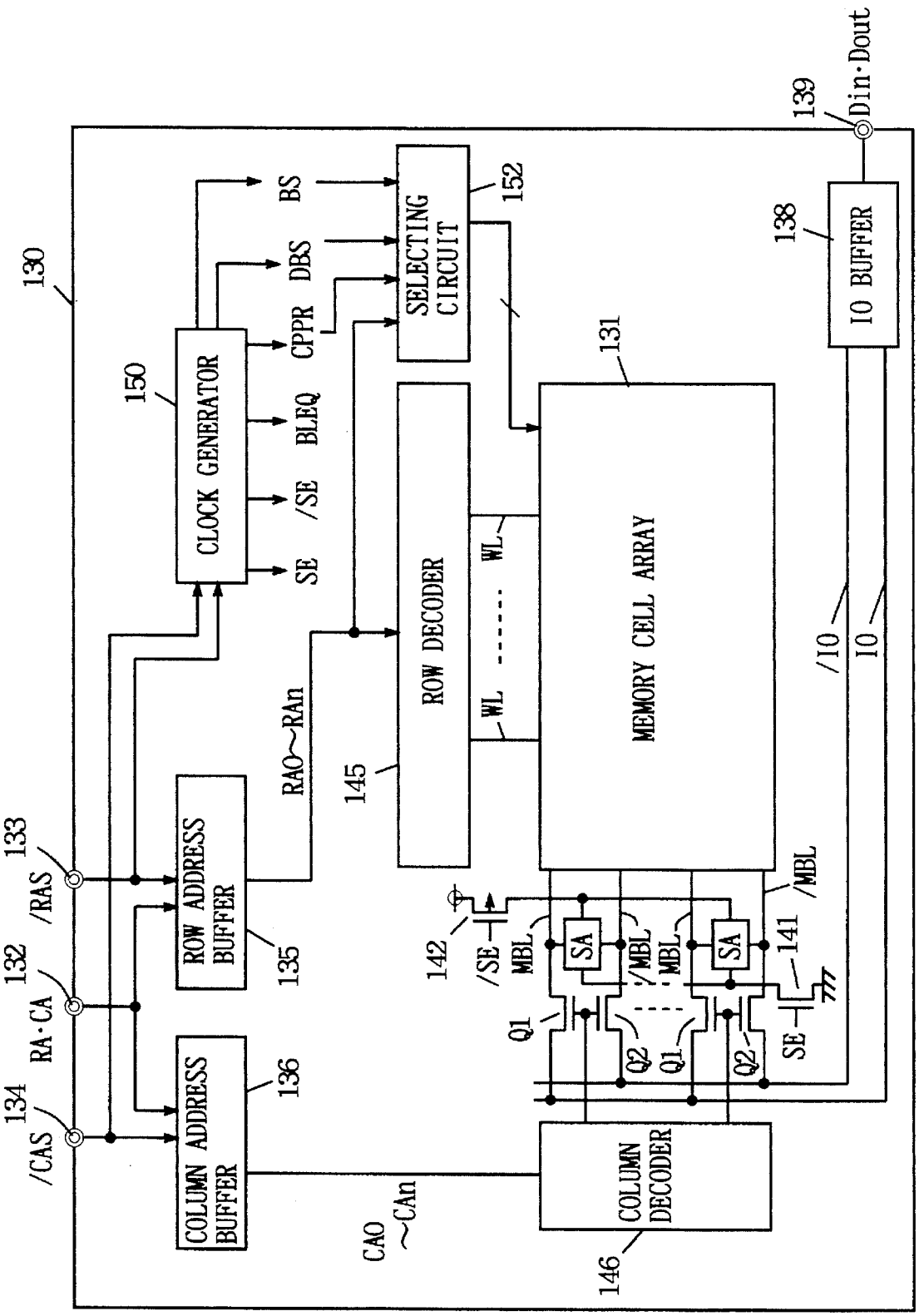
FIG. 10 schematically shows the entire structure of the semiconductor memory device shown in FIG. 6.

FIG. 10 is a block diagram schematically showing the entire structure of the semiconductor memory device according to Embodiment 2 of the present invention. In FIG. 10, a semiconductor memory device 130 includes a memory cell array 131 having memory cells arranged in rows and columns. In memory cell array 131, sub-bit lines, sub-cell plate lines and main bit lines are arranged as shown in FIG. 6.

Semiconductor memory device 130 further includes a row address buffer 135 strobing row address signal RA applied through an address input terminal 132 in response to row address strobe signal /RAS applied through a signal input terminal 133 to generate internal row address signals RA0 to RAn, and a column address buffer 136 strobing column address signal CA applied through address input terminal 132 in response to column address strobe signal /CAS applied through a signal input terminal 134 to generate internal column address signals CA0 to CAn. Row address signal RA and column address signal CA are applied to address input terminal 132 in a time division multiplexing manner.

Semiconductor memory device 130 further includes a row decoder 145 decoding internal row address signals RA0 to RAn to generate a signal for selecting a word line WL in memory cell array 131, and a column decoder 146 decoding internal column address signals CA0 to CAn to generate a signal for selecting a column in memory cell array 131. Decoding timings of row decoder 145 and column decoder 146 are determined by row address strobe signal RAS and column address strobe signal /CAS, respectively.

IO gate transistors Q1 and Q2 rendered conductive in response to a column select signal from column decoder 146 are provided for main bit lines MBL and /MBL, respectively. IO gate transistors Q1 and Q2 connect corresponding main bit lines MBL and /MBL to internal data bus lines IO and /IO upon selection. Internal data bus lines IO and /IO are connected to an IO buffer 138 carrying out input/output of external data through a data input/output terminal 139.

In FIG. 10, input data Din and output data Dout are shown being input/output through the same pin terminal. However, these data may be input/output through separate pin terminals. The data may be multibit data of a ×4 bit configuration, a ×8 bit configuration, or the like, not of a ×1 bit configuration.

Semiconductor memory device 130 further includes a clock generator 150 generating internal control clock signals in response to row address strobe signal /RAS and column address strobe signal /CAS, and a selecting circuit 152 receiving group select signals BS, DBS and CPPR from clock generator 150 and predetermined bits (address signal for group selection) of internal row address signals RA0 to RAn to transmit the active group select signal only to a selected group.

Clock generator 150 is also shown generating sense amplifier activation signals SE, /SE and precharge signal BLEQ. Sense amplifier activation signal SE is applied to the gate of a sense amplifier drive transistor 141. Sense amplifier activation signal /SE is applied to the gate of a sense amplifier drive transistor 142. Sense amplifier drive transistors 141 and 142 apply to sense amplifier SA a ground potential and an operating power supply potential upon conduction, respectively. Sense amplifier drive transistors 141 and 142 drive sense amplifier SA to amplify the potential difference between main bit lines MBL and /MBL.

In operation, selecting circuit 152 decodes an address signal (group address signal) of predetermined bits out of internal row address signals RA0 to RAn to determine a memory cell group to be selected. When the selected memory cell group is determined, selecting circuit 152 transmits group select signals BS, DBS and CPPR only to the selected memory cell group. Group select signals BSi, DBSi, and CPPRi to a non-selected memory cell group maintain in a precharge state. As a result, connection of the sub-bit line and one main bit line, transmission/non-transmission of constant reference voltage VBL to the sub-cell plate line, and connection of the sub-cell plate line and the other main bit line are effected only in the selected memory cell group. In the non-selected memory cell group, the sub-bit line and the sub-cell plate line are disconnected from the main bit line, and constant reference voltage VBL is transmitted to the sub-cell plate line.

When the read voltage appears on the main bit line, sense amplifier drive transistors 141 and 142 are rendered conductive in response to signals SE and /SE to activate sense amplifier SA. Then, in response to the output of column decoder 146, IO gate transistors Q1 and Q2 provided corresponding to the selected column are rendered conductive, and main bit lines MBL and /MBL corresponding to the selected column are connected to internal data bus lines IO and /IO. Input/output of data through an IO buffer 138 is carried out for the selected main bit lines MBL and /MBL.

[Embodiment 3]

Figure 11:
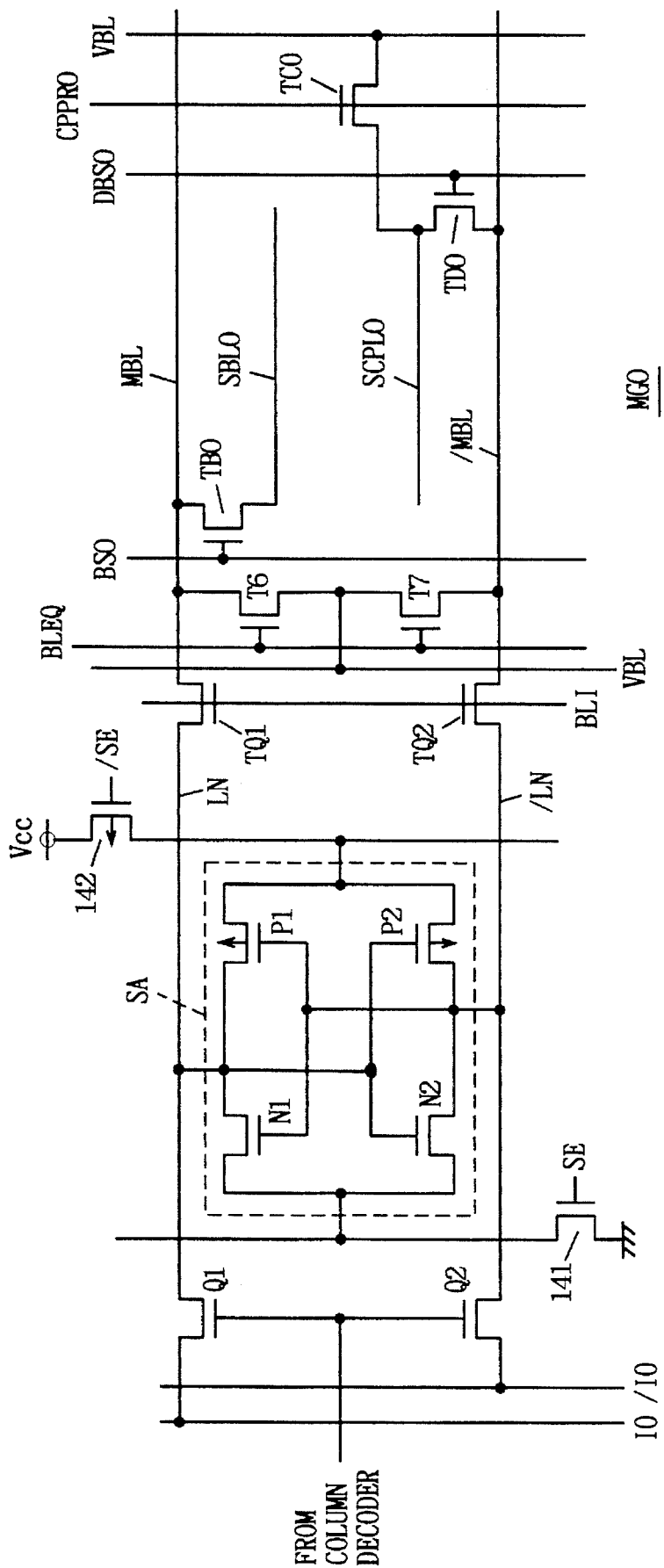
FIG. 11 is a diagram showing a structure of a main portion of a semiconductor memory device according to Embodiment 3 of the present invention.

FIG. 11 is a diagram showing a structure of a main portion of a semiconductor memory device according to Embodiment 3 of the present invention. In FIG. 11, a structure of One column of memory cell group MG0 is shown. In the structure shown in FIG. 11, switching transistors TQ1 and TQ2 rendered conductive in response to a disconnection control signal BLI are provided between latch nodes LN and /LN of sense amplifier SA and main bit lines MBL and /MBL.

Sense amplifier SA includes cross-coupled p channel MOS transistors P1 and P2, and cross-coupled n channel MOS transistors N1 and N2. Operational power supply potential Vcc is applied to one conduction electrode of each of p channel MOS transistors P1 and P2 through drive transistor 142. Ground potential is applied to one conduction electrode of each of n channel MOS transistors N1 and N2 through drive transistor 141. Since the structure of the memory group is similar to that shown in FIG. 6, the same reference characters are allotted to the same or corresponding portions, and description thereof will not be repeated. Operation of the semiconductor memory device shown in FIG. 11 will now be described with reference to the operational waveform diagram shown in FIG. 12.

When signal /RAS is at an inactive high level, precharge signal BLEQ is at a high level, group select signals BS0 and DBS0 are at a low level, and group select signal CPPR0 is at a high level. Disconnection control signal BLI is also at a high level. In this state, latch nodes LN and /LN of sense amplifier SA are connected to main bit lines MBL and /MBL, and precharged to a potential level of constant reference voltage VBL.

Sub-bit line SBL00 is in a floating state at the voltage VBL, and sub-cell plate line SCPL00 is precharged to constant reference voltage VBL.

When row address strobe signal /RAS falls to an active low level, applied address signal Add is strobed as row address signal RA, and row selection operation is initiated. In response to activation of signal /RAS, precharge signal BLEQ attains an inactive low level, and main bit lines MBL and /MBL and latch nodes LN and /LN of sense amplifier SA are brought to a floating state at the precharge potential VBL.

According to applied row address signal RA, a memory cell group including a selected word line is first determined. Based on determination of the selected memory cell group (memory cell group including a selected word line), second group select signal CPPR0 attains a low level, and sub-cell plate line SCPL00 is brought to a floating state at the intermediate potential VBL. It is assumed here that memory cell group MG0 is selected.

According to determination of the memory cell group, group select signals BS0 and DBS0 attain a high level, sub-bit line SBL00 is connected to main bit line MBL, and sub-cell plate line SCPL00 in a floating state is connected to complementary main bit line /MBL.

Then, a word line is selected, the potential of the selected word line (word line WL0 in FIG. 12) increases, and the potentials of main bit lines MBL and /MBL change according to information stored in the memory cell connected to the selected word line. The potential changes on main bit lines MBL and /MBL are transmitted to latch nodes LN and /LN of sense amplifier SA. When the difference between read potentials of latch nodes LN and /LN of sense amplifier SA becomes sufficiently large, second group select signal DBS0 attains a low level, and sub-cell plate line SCPL00 is disconnected from complementary main bit line /MBL.

In response to deactivation of second group second select signal DBS0, disconnection control signal BLI attains a low level, and main bit lines MBL and /MBL are disconnected from latch nodes LN and /LN of sense amplifier SA. In response to the falling of disconnection control signal BLI to a low level, sense amplifier activation signals SE and /SE are activated to attain a high level and a low level, respectively, and sense amplifier SA amplifies the potential difference between latch nodes LN and /LN.

Since parasitic capacitances of latch nodes LN and /LN of sense amplifier SA are very small, sense amplifier SA can carry out sensing operation at a high speed. Further, sense amplifier SA can be activated before reference voltage VBL is transmitted to sub-cell plate line SCPL00 (because latch nodes LN and /LN of sense amplifier SA are disconnected from main bit lines MBL and /MBL). Therefore, the sense amplifier can be activated at an earlier timing, resulting in data reading at a high speed. In parallel with sensing operation of sense amplifier SA, third group select signal CPPR0 attains a high level, and constant reference voltage VBL is transmitted to sub-cell plate line SCPL00. After sensing operation of the sense amplifier is completed, disconnection control signal BLI attains a high level, latch nodes LN and /LN of sense amplifier SA are connected to main bit lines MBL and /MBL, and the potentials of main bit lines MBL and /MBL change corresponding to the potentials of latch nodes LN and /LN of sense amplifier SA.

After restore operation of memory cell data is carried out, signal /RAS rises to a high level, and the potential of selected word line WL0 falls to a low level. Accordingly, sense amplifier activation signals SE and /SE are brought to an inactive low level and an inactive high level, respectively. In response to deactivation of sense amplifier activation signals SE and /SE, precharge signal BLEQ attains a high level, and main bit lines MBL and /MBL are precharged to the predetermined potential. After precharging of sub-bit line SBL00 to predetermined potential VBL through main bit line MBL is completed, group select signal BS0 attains a low level, and sub-bit line SBL00 is disconnected from main bit line MBL.

Figure 12:
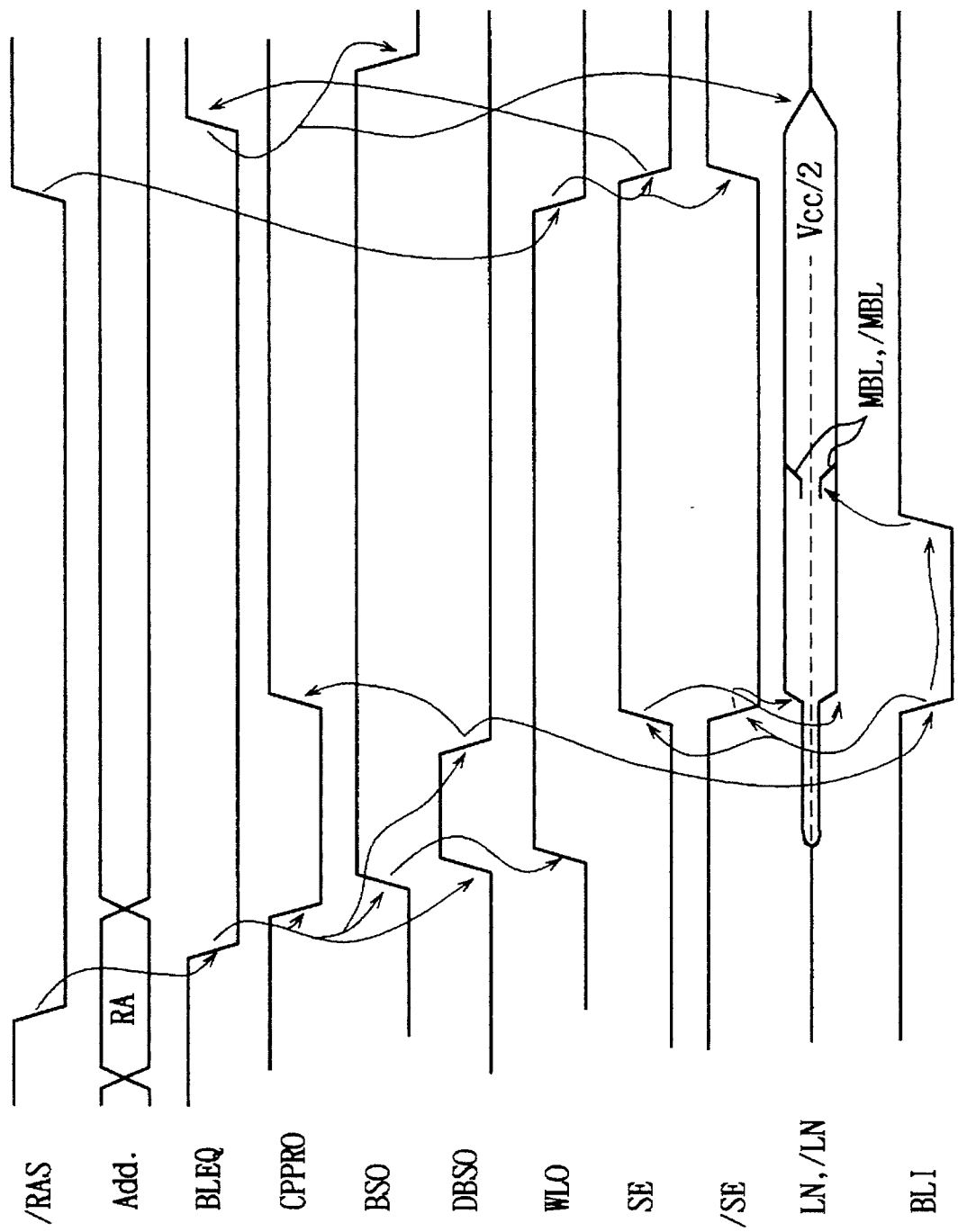
FIG. 12 is a signal waveform diagram showing operation of the semiconductor memory device shown in FIG. 11.

In a timing chart shown in FIG. 12, after group select signal DBS0 attains a low level and sub-cell plate line SCPL0 is disconnected from complementary main bit line /MBL, disconnection control signal BLI is brought to a low level. However, since complementary main bit line /MBL and latch node /LN of sense amplifier SA are disconnected from each other in sensing operation of sense amplifier SA, a structure may be used in which second group select signal DBS0 is brought to a low level after disconnection control signal BLI attains a low level, and in which sub-cell plate line SCPL0 is recharged at predetermined reference voltage VBL in parallel with sensing operation. In this case, since sense amplifier SA can be activated at an earlier timing, data can be read at a higher speed.

As described above, according to Embodiment 3, the sense amplifier is activated after the main bit line and the latch node of the sense amplifier are disconnected. Therefore, since sensing operation can be initiated earlier than charging of the sub-cell plate line to reference voltage VBL, data can be read at a high speed.

[Embodiment 4]

Figure 13:
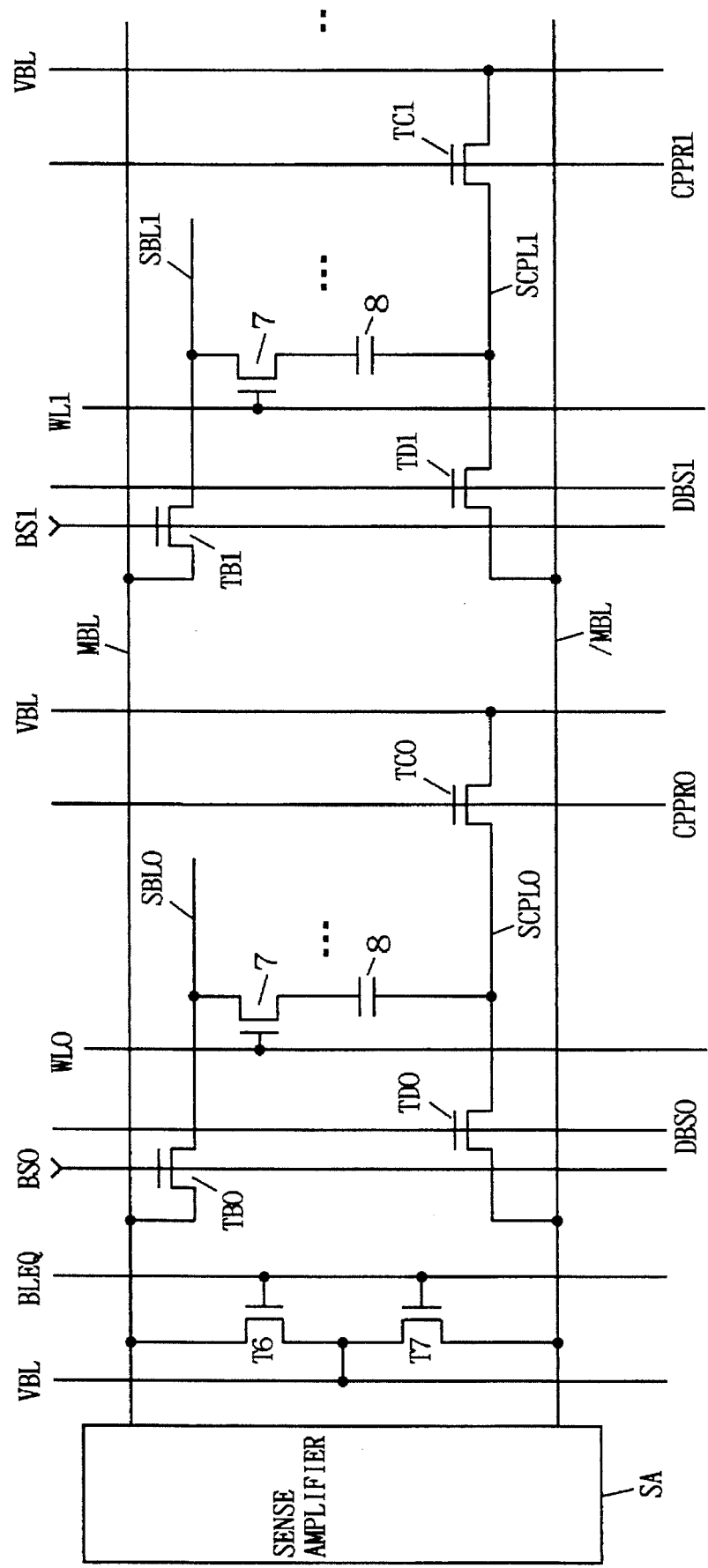
FIG. 13 is a diagram showing a structure of a main portion of a semiconductor memory device according to Embodiment 4 of the present invention.

FIG. 13 is a diagram showing a structure of a main portion of a semiconductor memory device according to Embodiment 4 of the present invention. In FIG. 13, a structure of two memory cell groups relating to main bit lines MBL and /MBL is shown.

In FIG. 13, memory cell transistor 7 and memory cell capacitor 8 are located between sub-bit line SBL0 and sub-cell plate line SCPL0. Similarly, memory cell transistor 7 and memory cell capacitor 8 are located between sub-bit line SBL1 and sub-cell plate line SCPL1.

Sub-bit line SBL0 is connected at one end portion (the left side in FIG. 13) to main bit line MBL through switching transistor TB0 receiving group select signal BS0 at its gate. Sub-cell plate line SCPL0 is connected at one end portion to main bit line /MBL through switching transistor TD0 receiving group select signal DBS0 at its gate. Switching transistor TD0 is provided on the same side as switching transistor TB0 provided on sub-bit line SBL0. The other end of sub-cell plate line SCPL0 is connected to receive constant reference voltage VBL through switching transistor TC0 receiving group select signal CPPR0 at its gate.

Sub-bit line SBL1 and sub-cell plate line SCPL1 are also connected to main bit lines MBL and /MBL through switching transistors TB1 and TD1, respectively, similarly to the arrangement of sub-bit line SBL0 and sub-cell plate line SCPL0. The other end of sub-cell plate line SCPL1 is connected to receive constant reference voltage VBL through switching transistor TC1.

With an array layout shown in FIG. 13, active region 100 can be used as switching transistors TB0 and TD0 in the layout shown in FIG. 8. The memory cells are all formed in active region 102 of FIG. 8. Therefore, in the arrangement shown in FIG. 13, the array can be structured by repeating the same pattern, facilitating the layout. Since charges are transmitted to main bit lines MBL and /MBL from end portions of sub-bit line SBL and sub-cell plate line SCPL on the same side, potential changes of main bit lines MBL and /MBL are transmitted to sense amplifier SA at the same time. In particular, since charges migrate from end portions of sub-bit line SBL and sub-cell plate line SCPL proximate to sense amplifier SA, the potentials of the latch nodes of sense amplifier SA can change at a high speed, and the sense amplifier can be activated at an earlier timing.

[Embodiment 5]

Figure 14:
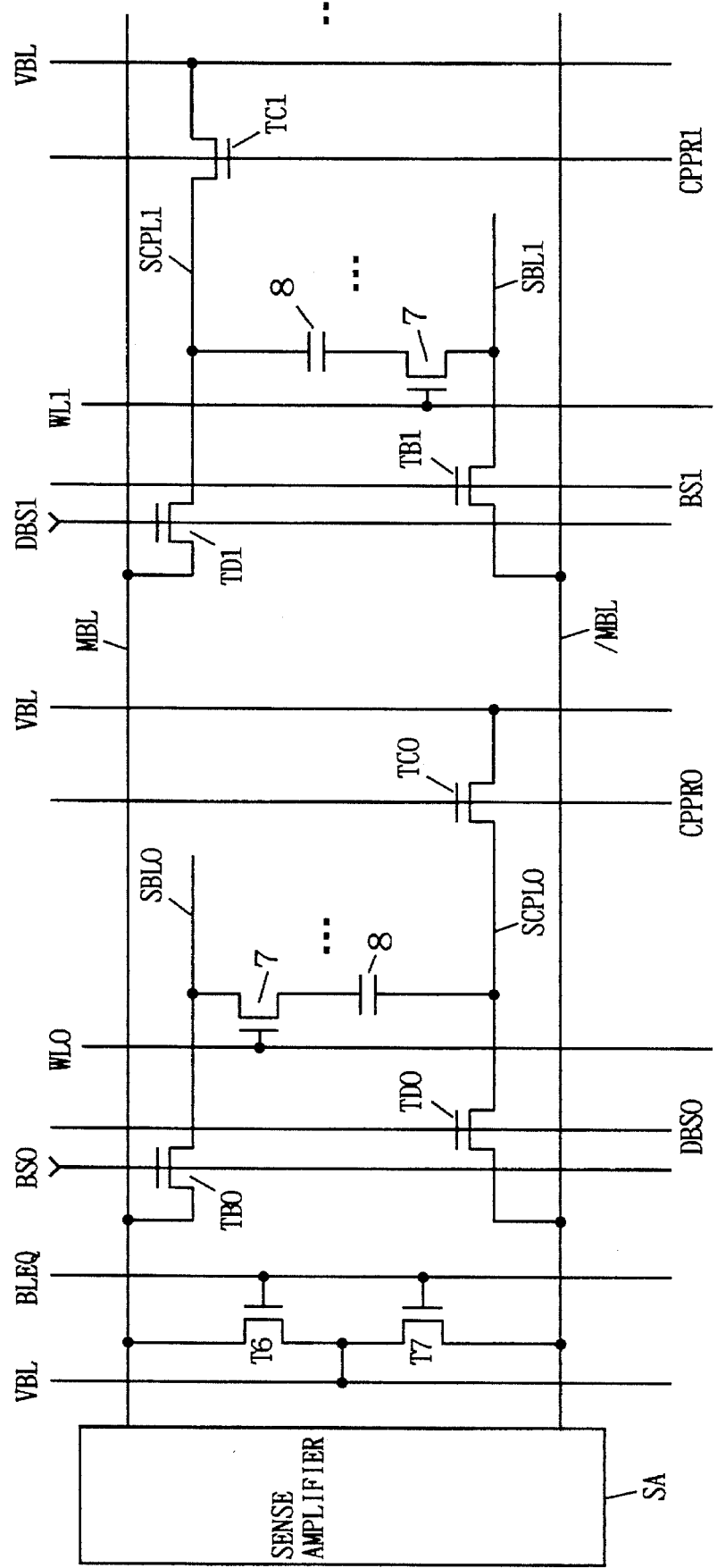
FIG. 14 is a diagram showing a structure of a main portion of a semiconductor memory device according to Embodiment 5 of the present invention.

FIG. 14 is a diagram showing a structure of a main portion of a semiconductor memory device according to Embodiment 5 of the present invention. In a structure shown in FIG. 14, a sub-bit line and a sub-cell plate line are arranged alternately in the column direction. Sub-bit line SBL0 is connected at an end portion proximate to sense amplifier SA to main bit line /MBL through switching transistor TB0 rendered conductive in response to group select signal SB0.

Sub-cell plate line SCPL0 is connected at an end portion proximate to sense amplifier SA to complementary main bit line /MBL through switching transistor TD0 rendered conductive in response to second group select signal DBS0. The other end of sub-cell plate line SCPL0 is connected to a constant voltage VBL transmission signal line through switching transistor TC0 rendered conductive in response to third group select signal CPPR0.

Sub-bit line SBL1 is connected at an end portion proximate to sense amplifier SA to complementary main bit line /MBL through switching transistor TB1 rendered conductive in response to first group select signal BS1. Sub-cell plate line SCPL1 is connected at an end portion proximate to sense amplifier SA to main bit line MBL through switching transistor TD1 rendered conductive in response to second group select signal DBS1. The other end of sub-cell plate line SCPL1 is connected to a constant reference voltage VBL transmission signal line through switching transistor TC1 rendered conductive in response to third group select signal CPPR1.

In the array layout shown in FIG. 14, sub-bit line SBL and sub-cell plate line SCPL are both coupled to main bit line MBL, and sub-bit line SBL and sub-cell plate line SCPL are also connected to complementary main bit line /MBL. Therefore, parasitic capacitances of main bit lines MBL and /MBL can be made equal to each other, and capacitances of main bit lines MBL and /MBL can be balanced, providing a sufficient sensing margin. This is because the signal propagation delay and the read potential difference can be set to the same value irrespective of whether memory cell data is transmitted to main bit line MBL or /MBL.

[Embodiment 6]

Figure 15:
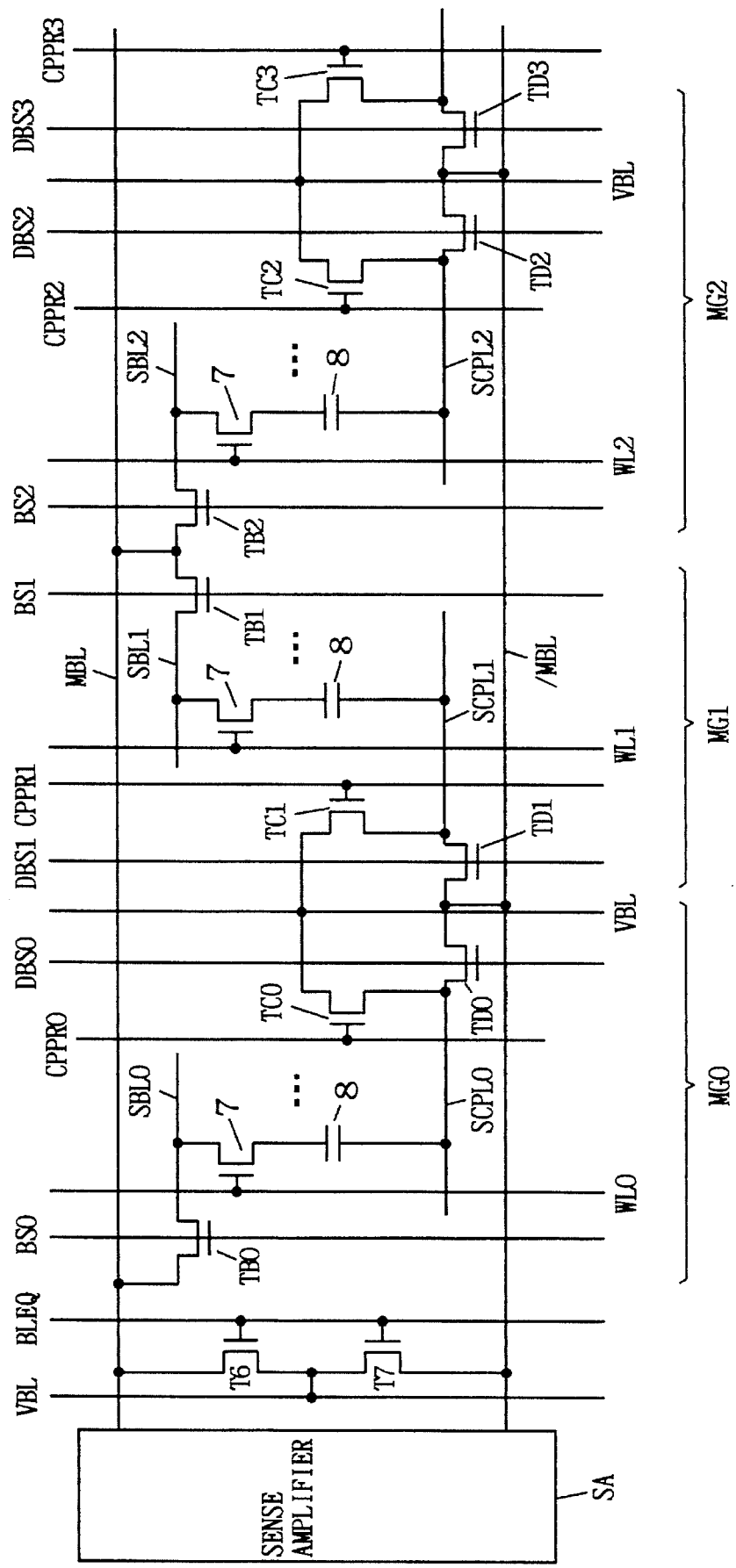
FIG. 15 is a diagram showing a structure of a main portion of a semiconductor memory device according to Embodiment 6 of the present invention.

FIG. 15 is a diagram showing a structure of a main portion of a semiconductor memory device according to Embodiment 6 of the present invention. In FIG. 15, a pair of main bit lines MBL and /MBL, and memory cell groups MG0 to MG2 are shown.

In FIG. 15, sub-bit line SBL0 is connected at an end portion proximate to sense amplifier SA to main bit line MBL through switching transistor TB0 responding to first group select signal BS0. Sub-cell plate line SCPL0 is connected at an end portion distant from sense amplifier SA to complementary main bit line /MBL through switching transistor TD0 responding to second group select signal DBS0. Sub-cell plate line SCPL0 also receives reference voltage VBL through switching transistor TC0 provided at an end portion distant from sense amplifier SA and responding to third group select signal CPPR0.

Sub-bit line SBL1 is connected at an end portion distant from sense amplifier SA to main bit line MBL through switching transistor TB1 responding to first group select signal BS1. Sub-cell plate line SCPL1 is connected at an end portion proximate to sense amplifier SA to complementary main bit line /MBL through switching transistor TB1 responding to second group select signal DBS1. Sub-cell plate line SCPL1 also receives constant reference voltage VBL through switching transistor TC1 responding to third group select signal CPPR1.

Sub-bit line SBL2 is connected at an end portion proximate to sense amplifier SA to main bit line MBL0 through switching transistor TB2 responding to first group select signal BS2. Sub-cell plate line SCPL2 is connected at an end portion distant from sense amplifier SA to complementary main bit line /MBL through switching transistor TD2 responding to second group select signal DBS2. Sub-cell plate line SCPL2 also receives constant reference voltage VBL through switching transistor TC2 responding to third group select signal CPPR2 at an end portion distant from sense amplifier SA.

Adjacent to switching transistor TD2, switching transistor TD3 is provided connecting a sub-cell plate line of memory cell group MG3 (not shown in FIG. 15) to complementary main bit line /MBL in response to group select signal DBS3. Switching transistor TC3 responding to group select signal CPPR3 is also provided in parallel with switching transistor TD3.

In the arrangement shown in FIG. 15, connection points of sub-bit line SBL and main bit line MBL are switched alternately between an end portion proximate to sense amplifier SA and an end portion distant therefrom in the column direction. Similarly, connection points of sub-cell plate line SCPL and complementary main bit line /MBL are switched alternately between an end portion distant from sense amplifier SA and an end portion proximate thereto. Therefore, adjacent sub-bit line pairs and adjacent sub-cell plate line pairs can be connected to main bit lines MBL and /MBL through the same regions, respectively. More specifically, switching transistors TB1 and TB2 can share one conduction region, and an area occupied by switching transistors TB1 and TB2 can be reduced (since only one contact region is required).

Similarly, switching transistors TD0 and TD1 share one conduction region. Therefore, also in this case, an area occupied by switching transistors TD0 and TD1 can be reduced. As a result, the pitch of a memory cell group in the column direction can be made small, and a high densitization of a memory cell array can be implemented.

[Embodiment 7]

Figure 16:
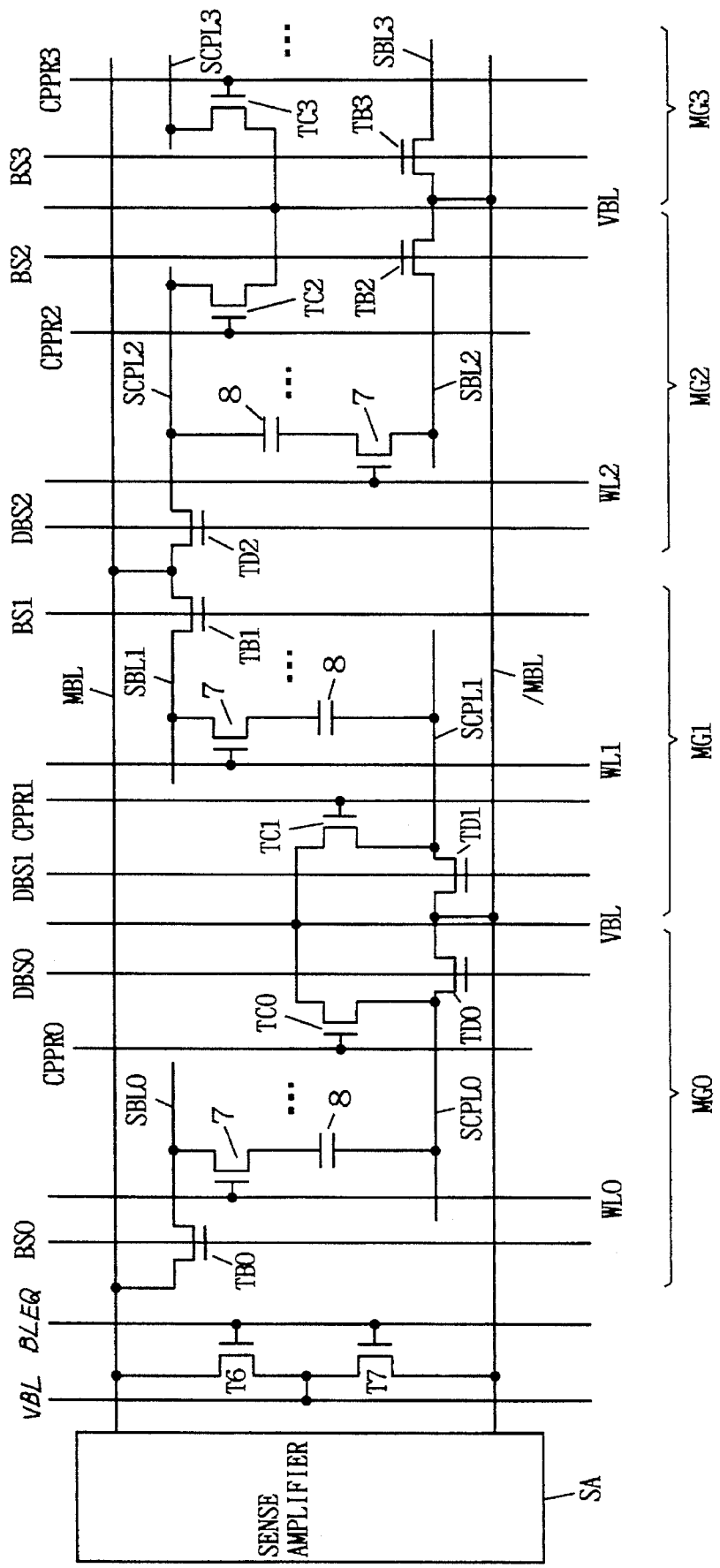
FIG. 16 is a diagram showing a structure of a main portion of a semiconductor memory device according to Embodiment 7 of the present invention.

FIG. 16 is a diagram showing a structure of a main portion of a semiconductor memory device according to Embodiment 7 of the present invention. In FIG. 16, a pair of main bit lines MBL and /MBL and three memory cell groups MG0 to MG2 are shown. Only a part of a memory cell group MG3 is also shown.

Referring to FIG. 16, in memory cell group MG0, sub-bit line SBL0 is connected at an end portion proximate to sense amplifier SA to main bit line MBL through switching transistor TB0. Sub-cell plate line SCPL0 is connected at an end portion distant from sense amplifier SA to complementary main bit line /MBL through switching transistor TD0. Sub-cell plate line SCPL0 receives reference voltage VBL through switching transistor TC0.

In memory cell group MG1, sub-cell plate line SCPL1 is connected at an end portion proximate to sense amplifier SA to complementary main bit line /MBL through switching transistor TD1. Sub-bit line SBL1 is connected at an end portion distant from sense amplifier SA to main bit line MBL through switching transistor TB1.

Sub-cell plate line SCPL1 is also connected at an end portion proximate to sense amplifier SA to a constant reference voltage VBL transmission line through switching transistor TC1.

In memory cell group MG2, sub-cell plate line SCPL2 is connected at an end portion proximate to sense amplifier SA to main bit line MBL through switching transistor TD2. Sub-cell plates CPL2 is connected at an end portion distant from sense amplifier SA to a reference voltage VBL transmission line through switching transistor TC2. Sub-bit line SBL2 is connected at an end portion distant from sense amplifier SA to complementary main bit line /MBL through switching transistor TB2.

Sub-cell plate line SCPL3 is connected at an end portion proximate to sense amplifier SA to a constant reference voltage VBL transmission line through switching transistor TC3. Sub-cell plate line SCPL3 is connected at an end portion (not shown) distant from sense amplifier SA to main bit line MBL. Sub-bit line SBL3 is connected at an end portion proximate to sense amplifier SA to complementary main bit line /MBL through switching transistor TB3.

Switching transistors TB0 to TB3 receive first group select signals BS0 to BS3, respectively, at their gates. Switching transistors TD0 to TD2 receive second group select signals DBS0 to DBS2, respectively, at their gates. Switching transistors TC0 to TC3 receive third group select signals CPPR0 to CPPR3, respectively, at their gates.

In the layout shown in FIG. 16, positions of sub-cell plate line SCPL and sub-bit line SBL are altered for every two memory cell groups in the column direction. More specifically, two sub-bit lines and two sub-cell plate lines are alternately arranged in the column direction. Also in this case, switching transistors for connecting the main bit line and the sub-cell plate line or the sub-bit line can share one conductive region. For example, switching transistor TB1 connecting sub-bit line SBL1 to main bit line MBL can share one conduction region with switching transistor TD2 connecting sub-cell plate line SCPL2 to main bit line MBL. Therefore, an area occupied by switching transistors TB1 and TB2 can be reduced.

Since the sub-bit line and the sub-cell plate line are formed in interconnection layers at different levels, interconnection layers at different levels are arranged for every two memory cell groups in the column direction. Therefore, the pitch of memory cell groups in the column direction can be made smaller.

Since sub-bit line SBL and sub-cell plate line SCPL are coupled both to main bit line MBL and complementary main bit line /MBL, parasitic capacitances of main bit lines MBL and /MBL can be made equal to each other.

[Embodiment 8]

Figure 17:
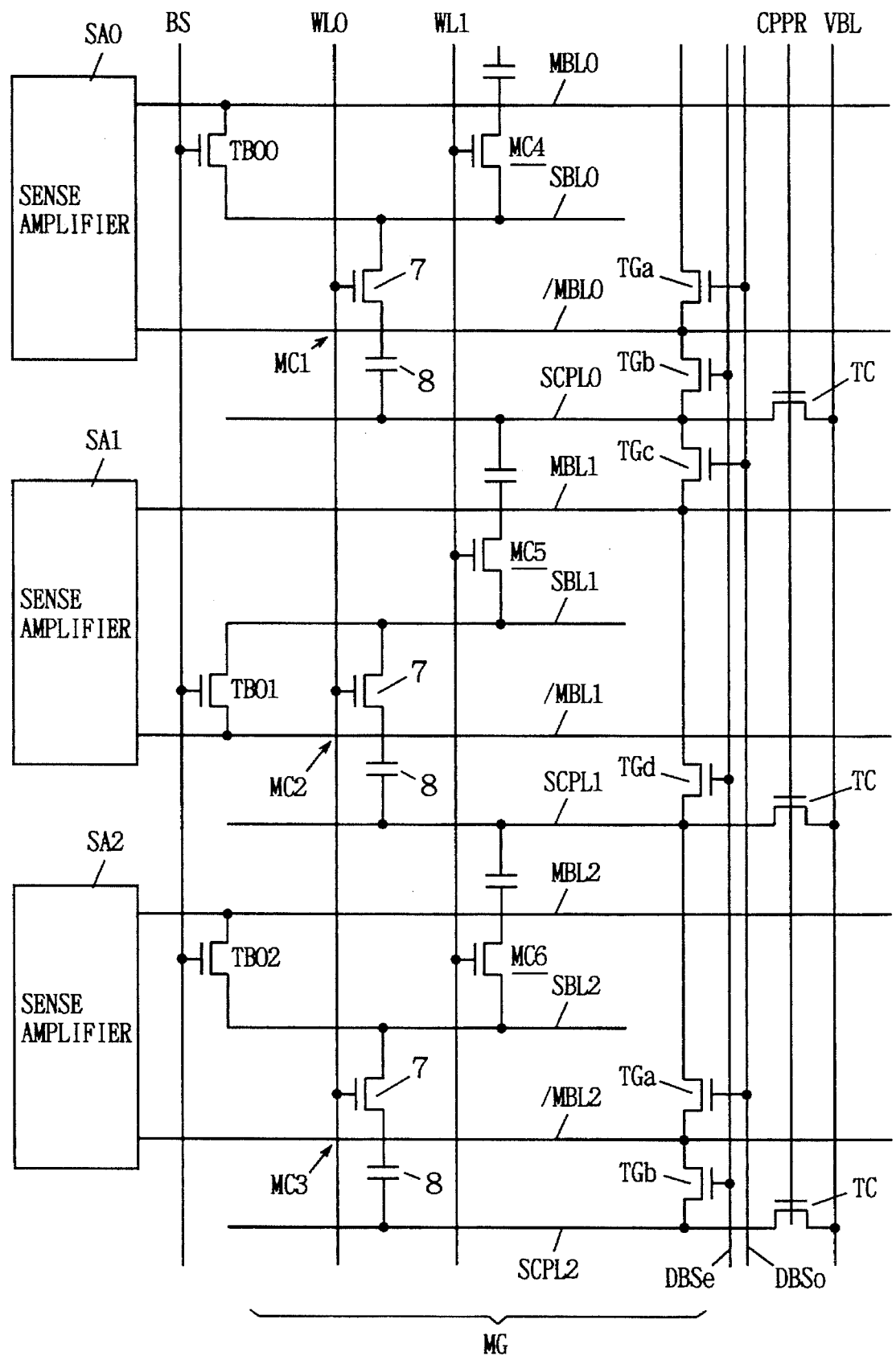
FIG. 17 is a diagram showing a structure of a main portion of a semiconductor memory device according to Embodiment 8 of the present invention.
Figure 18:
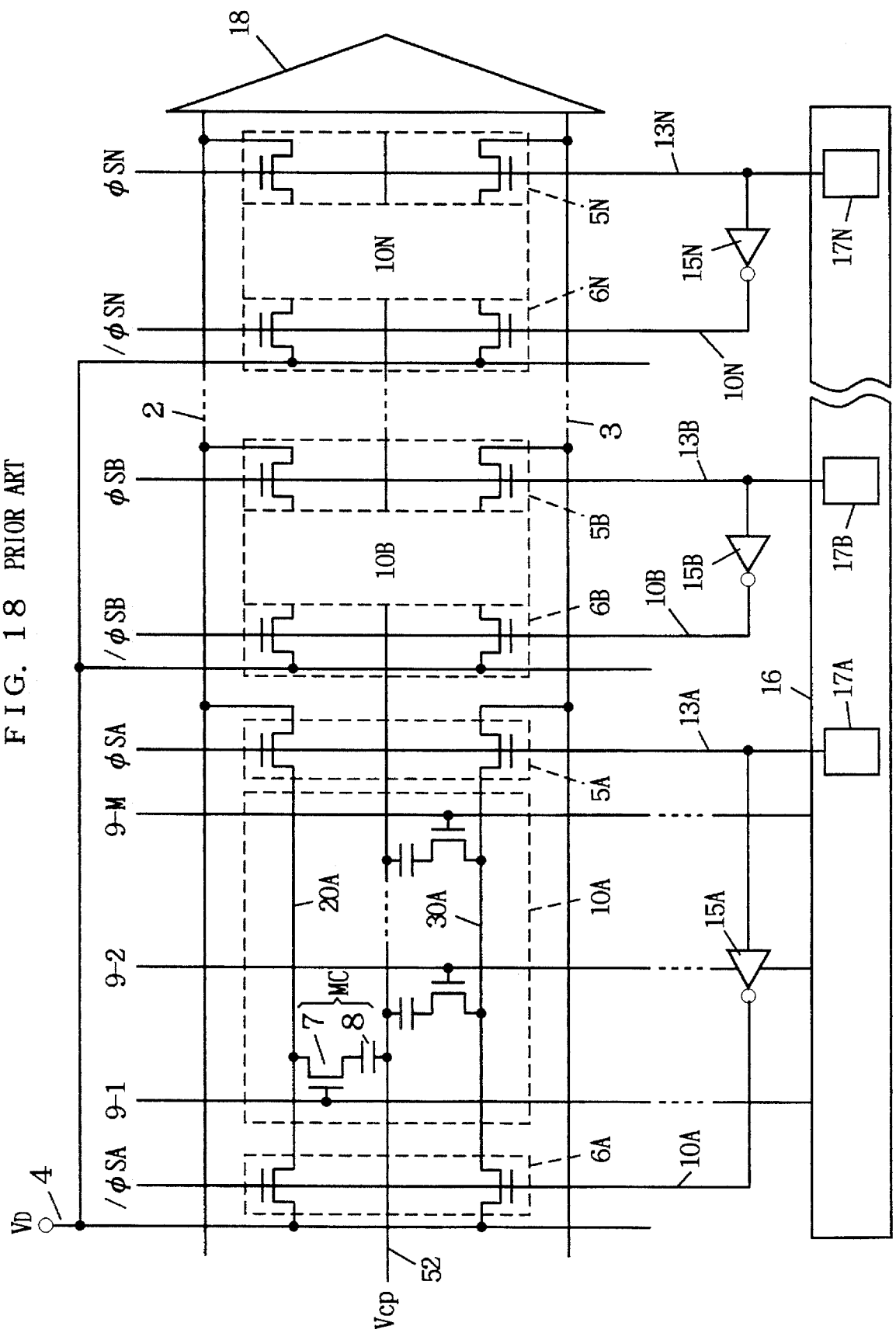
FIG. 18 is a diagram showing a main portion of a conventional semiconductor memory device.
Figure 19A:
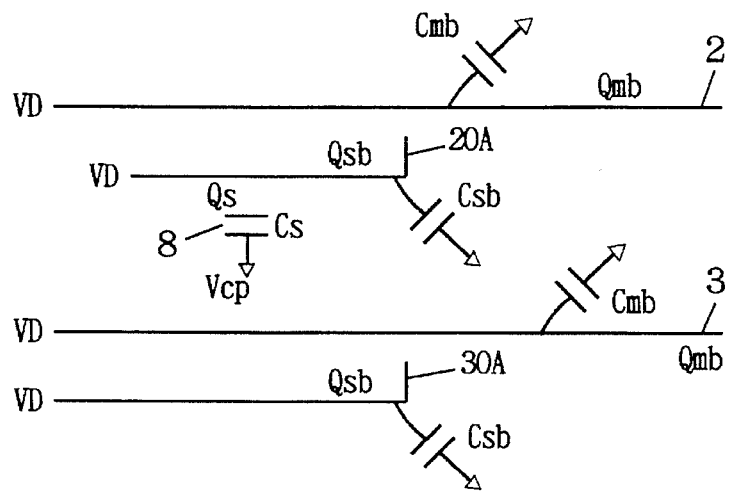
FIGS. 19A, 19B are diagrams showing schematically charges stored in a plastic capacitance in a precharge state of the conventional semiconductor memory device.
Figure 19B:
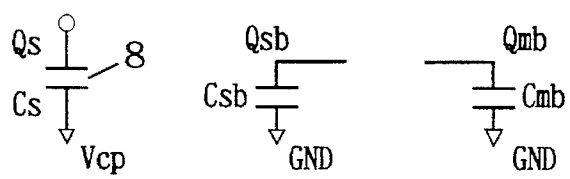
Figure 20A:
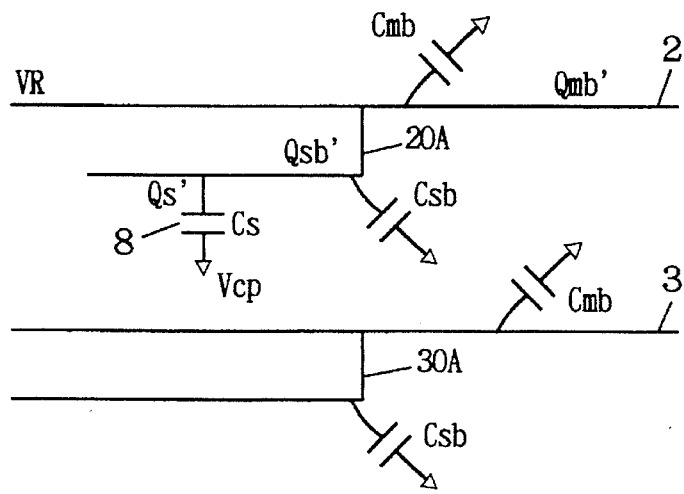
FIGS. 20A, 20B are diagrams schematically showing charges stored in a parasitic capacitance of a bit line upon selection of a word line in the conventional semiconductor memory device.
Figure 20B:
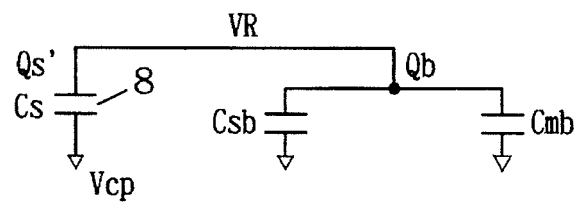

FIG. 17 is a diagram schematically showing a structure of a main portion of a semiconductor memory device according to Embodiment 8 of the present invention. In FIG. 17, an arrangement relating to three pairs of main bit lines MLB0, /MBL0 to MBL2,/MBL2, and one memory cell group MG is shown.

Sense amplifiers SA0 to SA2 are provided for main bit line pairs MLB0, /MBL0 to MBL2,/MBL2, respectively. Sub-bit line SBL0 is located between main bit line pair MBL0 and /MBL0, and sub-cell plate line SCPL0 is located between main bit line /MBL0 and adjacent main bit line MBL1. Similarly, sub-bit line SBL1 is arranged between main bit line pair MBL1 and /MBL1, and sub-cell plate line SCPL1 is arranged between complementary main bit line /MBL1 and adjacent main bit line MBL2. Sub-bit line SBL2 is arranged between main bit lines MBL2 and /MBL2. More specifically, a sub-bit line is located between paired main bit lines, and a sub-cell plate line is located between adjacent main bit lines. The sub-cell plate line is shared by memory cells on two columns.

Sub-bit line SBL0 is connected to main bit line MBL0 through a switching transistor TB00 responding to group select signal BS. Sub-bit line SBL1 is connected to complementary main bit line /MBL1 through a switching transistor TB01 responding to group select signal BS. Sub-bit line SBL2 is connected to main bit line MBL2 through a switching transistor TB02 responding to group select signal BS. Memory cells (MC1, MC2, and MC3) connected to an even-numbered word line (word line WL0, for example) are provided between a sub-bit line SBLi and a sub-cell plate line SCPLi, where i is 0 to 2.

Memory cells (MC4, MC5, and MC6) connected to an odd-numbered word line (word line W1, for example) are provided between sub-bit line SBLi and a sub-cell plate line SCPL (i-1).

Sub-cell plate lines SCPL0 to SCPL2 are connected to a constant reference voltage VBL transmission line through switching transistor TC responding to group select signal CPPR. A switching transistor TGa connects a complementary main bit line /MBLi to sub-cell plate line SCPL (i-1) in response to a group select signal DBSo. A switching transistor TGb connects sub-cell plate line SCPLi to complementary main bit line /MBLi in response to a group select signal DBSe. A switching transistor TGc connects main bit line MBLi to sub-cell plate line SCPL (i-1) in response to group select signal DBSo. A switching transistor TGd connects sub-cell plate line SCPLi to main bit line MBLi in response to group select signal DBSe. Group select signal DBSe is activated when a selected word line is an even-numbered word line. Group select signal DBSo is activated when a selected word line is an odd-numbered word line. Operation will now be described briefly.

When group select signal BS is activated, switching transistors TB00 to TB02 are brought to an on state, sub-bit line SBL0 is connected to main bit line MBL0, sub-bit line SBL1 is connected to complementary main bit line /MBL1, and sub-bit line SBL2 is connected to main bit line MBL2. Now, assume that a selected word line is word line WL0. In this state, memory cells MC1. MC2, and MC3 are selected. In memory cells MC1 and MC3, charges stored in capacitors 8 and 7 are transmitted through memory cell transistors to main bit lines MBL0 and MBL2 through sub-bit lines SBL0 and SBL2.

Since word line WL0 is an even-numbered word line, group select signal DBSe is brought to an active state, and switching transistors TGb and TGd are brought to an on state. Capacitor 8 of memory cell MC1 causes migration of charges on complementary main bit line /MBL0 through sub-cell plate line SCPL0 and switching transistor TGb.

As for main bit line pair MBL1 and /MBL1, sub-bit line SBL1 is connected to complementary main bit line /MBL1. In this state, capacitor 8 of memory cell MC2 causes charge migration on main bit line MBL1 through sub-cell plate line SCPL1 and switching transistor TGd. Memory cell MC3 causes charge migration on main bit line MBL2 through memory cell transistor 7, and also causes charge migration on complementary main bit line /MBL2 through sub-cell plate line SCPL2 and switching transistor TGb. As a result, a large read potential difference is generated in each main bit line pair.

Now, consider the case where word line WL1 is selected. Since the number of word line WL1 is an odd number, group select signal DBSo is activated. In this state, memory cell MC4 causes the migration of charges on main bit line MBL0 through its transistor 7, and also causes the complementary migration of charges of complementary main bit line /MBL0 through a sub-cell plate line, not shown, and switching transistor TGa.

Memory cell MC5 causes the charge migration on complementary main bit line /MBL1 through the memory cell transistor 7, and also causes complementary charge migration on main bit line MBL1 through sub-cell plate line SCPL0 and switching transistor TGc.

Memory cell MC6 causes the charge migration on main bit line MBL2 through the memory cell transistor, and also causes the complementary charge migration on complementary main bit line /MBL2 through sub-cell plate line SCPL1 and switching transistor TGa.

A read potential difference corresponding to information stored in a selected memory cell between corresponding main bit lines can be reliably generated, by selectively driving switching transistor for connecting a sub-cell plate line and a main bit line according to whether a selected word line is an even-numbered word line or an odd-numbered word line.

For each sub-cell plate line SCPL, two switching transistors are provided for connection to main bit lines. Parasitic capacitances of the sub-cell plate lines are all made the same.

In the case of the structure shown in FIG. 17, the pitch condition of sub-bit lines is alleviated, and the pitch condition of sub-cell plate lines is also alleviated, since the sub-cell plate line is located between adjacent main bit lines. Since the sub-cell plate line is provided in a layer under the main bit line, the sub-cell plate lines in non-selected memory cell groups can serve as a shield layer for the main bit line, reducing a parasitic capacitance of the main bit line. When the sub-cell plate line is formed in an interconnection layer at the same level as that of the main bit line, the capacitance coupling between adjacent main bit lines can be prevented, and noise generation due to the capacitance coupling of the main bit lines in sensing operation can be prevented, resulting in reliable sensing operation.

In the structures shown in Embodiments 1 to 8, sense amplifiers are located only on one side of a main bit line. Sense amplifiers may be located alternately on both sides of the main bit lines. A shared sense amplifier structure may be used in which a sense amplifier is shared by two pairs of main bit lines.

As described above, according to one aspect of the present invention, a bit line is formed in a hierarchical structure of sub-bit lines and a main bit line, and one sub-bit line and one cell plate line are provided between paired main bit lines. As a result, even if the pitch of main bit lines is made small, a sub-bit line and a cell plate line can be located with a sufficient margin. Since only two memory cells are located between paired main bit lines, layout of memory cells is facilitated.

Since memory cell capacitors are connected to one main bit line through memory cell transistors, and a sub-cell plate line brought to a floating state is connected to the other main bit line upon selection of a word line, a read potential difference between main bit lines can be increased. Even if a capacitance value of a memory cell capacitor is small, a read potential difference of a sufficient magnitude can be obtained, and sense operation can be reliably carried out. As a result, a semiconductor memory device of a large capacity can be obtained which is highly densitized, highly integrated, and operates at high speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of memory cells arranged in rows and columns and divided into groups of rows of memory cells, each of said plurality of memory cells including a capacitor having a storage node and a cell plate node for storing data and an access transistor;
   a plurality of pairs of main bit lines arranged corresponding to the columns of the memory cells;
   a plurality of sub-column lines arranged corresponding to the columns and to the groups of rows of memory cells, each of said sub-column lines connecting the access transistors of a corresponding group on a corresponding column;
   a plurality of sub-cell plate lines provided corresponding to said plurality of sub-column lines and connecting the cell plate nodes of capacitors of memory cells of corresponding groups on corresponding columns;
   a plurality of first switching means provided for each of said plurality of sub-column lines and responsive to a first group select signal, each for connecting a corresponding sub-column line to one of main bit lines of a corresponding pair of main bit lines;
   a plurality of second switching means provided corresponding to said plurality of sub-cell plate lines and each responsive to a second group select signal for connecting a corresponding sub-cell plate line to another main bit line of the corresponding pair of main bit lines; and
   a plurality of third switching means provided corresponding to said plurality of sub-cell plate lines and each responsive to a third group select signal for isolating a corresponding sub-cell plate line from a reference voltage source supplying a predetermined reference voltage for a predetermined time period.

2. A semiconductor memory device according to claim 1, wherein each of said plurality of sub-column lines includes a pair of sub-bit lines, and each of said first switching means includes a first switching element provided for one of a corresponding pair of sub-bit lines, and a second switching element provided for the other of the corresponding pair of sub-bit lines,
   each of the groups of memory cells further divided into first and second subgroups, memory cells of the first subgroup connected to one sub-bit line of a corresponding pair, and memory cells of the second subgroup connected to another sub-bit line of the corresponding pair,
   said first group select signal including subgroup designating information to render conductive one of the first and second switching elements, provided for a sub-bit line connecting a designated subgroup of memory cells.

3. A semiconductor memory device according to claim 2, wherein each of said plurality of second switching means includes a third switching element for connecting a corresponding sub-cell plate line to one of main bit lines of a corresponding pair, and a fourth switching element for connecting the other of the main bit lines of the corresponding pair, said second group select signal including subgroup designating information to render conductive one of the third and fourth switching elements to connect a corresponding sub-cell plate line to a corresponding main bit line complementary to the main bit line connecting the designated sub-group of memory cells.

4. A semiconductor memory device according to claim 1, wherein each of said plurality of third switching means is kept conductive except when said third group select signal for a group of memory cells is active and the group of memory cells is selected.

5. A semiconductor memory device according to claim 1, wherein each of said plurality of sub-column lines comprises a sub-bit line connecting access transistors of memory cells of a corresponding group, and each of said plurality of first switching means comprises a first switching element provided for a corresponding sub-bit line of a corresponding pair of main bit lines, and each of said plurality of second switching means comprises a second switching element provided for a corresponding sub-cell plate line.

6. A semiconductor memory device according to claim 5, wherein sub-bit lines and sub-cell plate lines are alternately arranged in a main bit line extending direction.

7. A semiconductor memory device according to claim 5, wherein a first switching element and a second switching element are placed at opposite side portions in a corresponding group.

8. A semiconductor memory device according to claim 5, wherein a first switching element and a second switching element are placed at one side portion in a corresponding group of rows.

9. A semiconductor memory device according to claim 5, wherein first switching elements in adjacent groups are located to share one conduction electrode node with each other.

10. A semiconductor memory device according to claim 5, wherein second switching elements in adjacent groups are located to share one conduction electrode node of each of said second switching elements.

11. A semiconductor memory device according to claim 5, wherein each of said plurality of third switching means comprises a third switching element, and wherein a second switching element and a third switching element are placed on one side portion in a corresponding group.

12. A semiconductor memory device according to claim 5, wherein each of said plurality of third switching means comprises a third switching element, and wherein a third switching element and a second switching element are placed at opposite side portions in a corresponding group.

13. A semiconductor memory device according to claim 5, wherein sub-bit lines and sub-cell plate lines on a column are alternately arranged on a basis of a predetermined number.

14. A semiconductor memory device according to claim 13, wherein switching elements provided for adjacent lines in adjacent groups are arranged to share one conduction electrode node with each other and a first switching element and a second switching element in a group are located at opposite side portions in the group.

15. A semiconductor memory device according to claim 1, wherein a sub-column line and a main-bit line and a sub-cell plate line are formed of interconnection layers at different levels from each other.

16. A semiconductor memory device according to claim 1, wherein each of said groups of rows is further divided into first and second subgroups, and wherein each of said sub-cell plate lines connects storage nodes of capacitors of memory cells of different subgroups on adjacent columns.

17. A semiconductor memory device according to claim 16, wherein each of said plurality of sub-column lines comprises a sub-bit line, and wherein said sub-bit line and said sub-cell plate line are arranged such that a main bit line is located therebetween in a planar view.

18. A semiconductor memory device according to claim 16, wherein each of said plurality of third switching means includes a first switching element for connecting a corresponding sub-cell plate to a main bit line and a second switching element for connecting the corresponding sub-cell plate to a main bit line in an adjacent pair of main bit lines, so that when a main bit line receives a selected memory cell data in a pair, another main bit line in the pair is coupled to a sub-cell plate line.

19. A semiconductor memory device according claim 1, wherein said plurality of memory cells includes a first through an n-th memory cells in a group on a column, and wherein each of said plurality of pairs of main bit lines comprises a first conductive layer serving as one main bit line and a second conductive layer serving another main bit line, said first and second conductive layers spaced apart from each other and extending in parallel in a column direction, and each of said plurality of sub-column lines comprises a third conductive layer arranged between and in parallel with the first and second conductive layers on a corresponding column in a planar view, and wherein each of said first through n-th memory cells is formed in an active region having one conduction region placed under and in parallel with one of the first and second conductive layers, and another conduction region formed oblique to the first and second conductive layers on a corresponding column and being contacted with the third conductive layer on a corresponding group on the corresponding column.

20. A semiconductor memory device according to claim 19, wherein said other conduction region is shared between two adjacent memory cells among second through (n−1)th memory cells in said first through n-th memory cells, so that active regions for two adjacent memory cells are placed in a point symmetrical fashion with respect to the other conduction region shared between the two adjacent memory cells.

21. A semiconductor memory device according to claim 20, wherein each of said plurality of first switching means comprises a first transistor formed in an active region having one conduction region placed under and in parallel with and contacted with one of a corresponding pair of main bit lines, and another conduction region formed oblique to the corresponding pair of main bit lines and contacted with a corresponding sub-cell plate line, the other conduction region of said first transistor is shared by the other conduction region of said first memory cell of a corresponding group, so that the one conduction region of the first transistor and the one conduction region of an access transistor of the first memory cell are placed under different main bit lines in a corresponding column.

22. A semiconductor memory device according to claim 19, wherein each of said second switching means comprises a second transistor formed in an active region placed under and in parallel with an contacted on one conduction region with a main bit line different from the main bit line having the first transistor contacted therewith and having another conduction region contacted with a corresponding sub-cell plate line.

23. A semiconductor memory device according to claim 22, wherein said first transistor and said second transistor are placed on opposite side portions on a corresponding group on the corresponding column.

24. A semiconductor memory device according to claim 21, wherein each of said third switching means comprises a second transistor formed in an active region placed in parallel with main bit lines of the corresponding column and having one conduction region contacted with a corresponding sub-cell plate line and another conduction region contacted with a conductive layer extending in a row direction for transmitting the predetermined potential.

25. A semiconductor memory device according to claim 24, wherein said first transistor and said second transistors are formed at opposite side portions in a corresponding group on the corresponding column.

26. A semiconductor memory device according to claim 19, wherein each of said sub-cell plate lines comprises a fourth conductive layer placed above the third conductive layer in a corresponding group, and wherein said first and second conductive layers are placed above said fourth conductive layer.

27. A semiconductor memory device according to claim 26, wherein each of said rows is provided with a word line having a fifth conductive layer connecting access transistors of memory cells of a corresponding row and placed below the third conductive layer, and a sixth conductive layer arranged over the first and second conductive layers and contacted with the fifth conductive layers at predetermined intervals.

28. A semiconductor memory device according to claim 26, wherein each of said cell plate nodes of the capacitors of the memory cells comprises an electrode layer arranged above the third conductor layer and below the fourth conductive layer in a corresponding group, said electrode layer formed in an overlapped arrangement with one of the first and second conductive layers in the corresponding group.

29. A semiconductor memory device according to claim 1, further including a plurality of sense amplifiers provided for each of said plurality of pairs of main bit lines, for amplifying potential difference on corresponding pairs of main bit lines, and a plurality of fourth switching means provided between said plurality of sense amplifiers and said plurality of pairs of main bit lines, and wherein said third group select signal is made active for a first predetermined time period to isolate a designated sub-cell plate line from the reference voltage source, said second group select signal is made active for a second predetermined period to couple the designated sub-cell plate line to a corresponding main bit line during said first predetermined time, said plurality of fourth switching means are made non-conductive for a third predetermined period after said second predetermined period, and said plurality of sense amplifiers are made active in said third predetermined period to start the operation of amplification.

* * * * *